(12) United States Patent
Aweya et al.

(10) Patent No.: US 7,130,368 B1
(45) Date of Patent: Oct. 31, 2006

(54) CLOCK RECOVERY USING A DIRECT SMOOTHING PROCESS

(75) Inventors: James Aweya, Kanata (CA); Michel Ouellette, Plantagenet (CA); Delfin Y. Montuno, Kanata (CA); Kent E. Felske, Kanata (CA)

(73) Assignee: Nortel Network Limited, St. Laurent ( * ) Notice: Subject to any disclaimer, the term of this patent is extended or adjusted under 35 U.S.C. 154(b) by 835 days.

(21) Appl. No.: 10/246,399

(22) Filed: Sep. 19, 2002

(51) Int. Cl.
*H03D 3/24* (2006.01)

(52) U.S. Cl. .................. 375/376; 375/326; 713/400

(58) Field of Classification Search ............... 375/222, 375/371, 230, 376, 326; 370/468, 503, 466, 370/465, 395.6, 395.64, 394, 516, 389, 464; 348/497, 512, 518; 327/147, 156, 141; 703/400
See application file for complete search history.

(56) References Cited

U.S. PATENT DOCUMENTS

| | | | |
|---|---|---|---|
| 6,208,643 B1* | 3/2001 | Dieterich et al. | 370/389 |
| 6,449,291 B1* | 9/2002 | Burns et al. | 370/516 |
| 6,650,719 B1* | 11/2003 | Baker | 375/371 |
| 6,744,764 B1* | 6/2004 | Bigdeliazari et al. | 370/394 |
| 6,744,782 B1* | 6/2004 | Itakura et al. | 370/466 |
| 6,834,057 B1* | 12/2004 | Rabenko et al. | 370/468 |
| 7,020,791 B1* | 3/2006 | Aweya et al. | 713/400 |
| 2002/0044620 A1* | 4/2002 | Spijker et al. | 375/371 |
| 2002/0141451 A1* | 10/2002 | Gates et al. | 370/503 |

OTHER PUBLICATIONS

Receiver buffer control for variable bit-rate real-time video; Lau, R.C. et al; Communications, 1992. ICC 92, Conference record, SUPERCOMM/ICC '92, Discovering a New World of Communications. IEEE International Conference on; Jun. 14-18, 1992 pp. 544-550 vol. 1.*

On source timing recovery for circuit emulation in ATM networks Vakil, F.; Global Telecommunications Conference, 1989, and Exhibition. 'Communications Technology for the 1990s and Beyond'. GLOBECOM '89., IEEE; Nov. 27-30, 1989 pp. 1820-1827 vol. 3.*

ATM circuit emulation-a comparison of recent techniques; Ahmed, K.M.; Hluchyj, M.G.; Global Telecommunications Conference, 1991. GLOBECOM '91. Countdown to the New Millennium. Featuring a Mini-Theme on: Personal Communications Services; Dec. 2-5, 1991 pp. 370-374 vol. 1.*

Efficient linear-quadratic filtering; Yi-Chyun Tseng; Linebarger, D.A.; Circuits and Systems II: Analog and Digital Signal Processing, IEEE Transactions on [see also Circuits and Systems II: Express Briefs, IEEE Transactions on] vol. 43, Issue 5. May 1996 pp. 397-400.*

R. Noro et al, "Circuit Emulation over IP Networks", IFIP 6th Inter. Workshop on Protocols for High-Speed Networks, Salem—MA, USA, Aug. 1999, pp. 187-201.

ATM Forum af-vtoa-0078.000, "Circuit Emulation Service Interoperability Specification Version 2.0", Jan. 1997.

R. C. Lau et al., "Synchronous Techniques for Timing Recovery in BISDN", Proc. IEEE Globecom, 1992, pp. 814-820.

G. F. Andreotti et al., "Clock Recovery and Reconstruction of PAL Pictures for MPEG Coded Streams Transported Over ATM Networks", IEEE Trans. Circuits and Systems for Video Technology, vol. 5, No. 6, Dec. 1995, pp. 508-514.

* cited by examiner

*Primary Examiner*—Temesghen Ghebretinsae
(74) *Attorney, Agent, or Firm*—Hunton & Williams LLP

(57) ABSTRACT

A system and method for synchronizing a local clock to a reference clock using a linear model of the error between the local clock and the reference clock is disclosed. In one embodiment, a direct smoothing process is used in conjunction with the linear model to estimate a frequency offset by which the frequency of an oscillator of the local clock is adjusted. Also disclosed herein is a phased-lock loop (PLL) adapted to synchronize a local clock with a reference clock using the direct smoothing process, as well as a system implementing the PLL for timing the playout of data received from a transmitter.

17 Claims, 6 Drawing Sheets

CLOCK RECOVERY USING A DIRECT SMOOTHING PROCESS

FIELD OF THE INVENTION

The present invention relates generally to clock synchronization between a local clock and a reference clock and, more particularly, to a technique for clock synchronization based in part on a direct smoothing process of the error between the local clock and the reference clock.

BACKGROUND OF THE INVENTION

Clocking at the physical interface of a transmitter or receiver typically controls the speed at which data is transmitted/received on the physical connection. To eliminate transmission jitter resulting from the transmission of data, a jitter buffer often is needed at the receiver. The arrival rate and the departure rate from the jitter buffer typically are controlled, respectively, by the transmitter clock and the receiver clock. Ideally, the same amount of data is transmitted or forwarded at every point in the connection within any given time window when the transmitter clock and reference clock are synchronized. If the physical interfaces along a connection are not synchronized (i.e., not driven by a clocking signal of a substantially similar or equal frequency), data can be lost due to buffer overflow or underflow, resulting in periodic line errors. To keep a stable buffer level, frequency offsets between the transmitter and receiver often are eliminated or reduced either through driving the transmitter clock and receiver clock from a common global clock, or slaving the receiver clock to a transmitter clock by means of a phase-locked loop (PLL) which derives its reference clock signal from clock information provided by the transmitter clock.

One technique commonly implemented in packet-switched networks includes the synchronization of the transmitter clock and the receiver clock using timestamps (see, e.g., R. C. Lau and P. E. Fleischer, "Synchronous Techniques for Timing Recovery in BISDN," Proc. IEEE GLOBECOM, 1992, pp. 814–820). The transmitter sends a series of explicit time references as timestamps in a sequence of packets and the timestamps are used by the receiver to synchronize its clock to that of the transmitter. Since no common network clock is used, the receiver relies on locking its clock to the arrival of the timestamps. This technique is analogous to the common method of periodic insertion of synchronizing patterns into a bit stream at the transmitter, whereby the receiver is adapted to detect these synchronizing patterns and use them to generate a reference clock signal for a PLL at the receiver.

Techniques have been developed for clock synchronization using a linear modeling of the error between the transmitter clock and the receiver clock. Using a linear regression analysis, the frequency offset between the transmitter clock and a receiver clock for a given time period or time instance is estimated or predicted and the receiver clock then is adjusted by this estimated error.

However, a major disadvantage in the use of the linear regression analysis as an estimation technique (as described above) is that a relatively large number of time series values is needed to accurately estimate the model coefficients at the end of each period. The storage capacity for storing a large number of time series and the associated calculations could be prohibitive.

One clock synchronization technique based on a least-squares linear regression analysis is disclosed in a paper by R. Noro, M. Hamdi, and J. P. Hubaux, "Circuit Emulation over IP Networks," *IFIP 6th Inter. Workshop on Protocols for High-Speed Networks*, Salem, Mass., August 1999, pp. 187–201. This least-squares linear regression analysis-based clock synchronization technique observes and processes a relatively large sequence of consecutive clock samples (i.e., timestamps) to generate accurate timing signals. Although this technique and others based on least-squares linear regression analysis generally perform considerably more efficiently than conventional second-order PLLs, these techniques have the drawback of requiring large number of clock samples (thus, a large storage requirement) in order to generate accurate timing signals.

In view of the foregoing, it would be desirable to provide a technique for synchronizing a receiver clock with a transmitter clock that overcomes the above-describe inadequacies and shortcomings. More particularly, it would be desirable to provide a technique for timestamp-based clock synchronization between a transmitter and a receiver in a packet-switched network in an efficient and cost-effective manner.

SUMMARY OF THE INVENTION

In accordance with one embodiment of the present invention, a method for synchronizing a clock of a receiver with a clock of a transmitter is provided, wherein the transmitter is adapted to transmit a sequence of time references to the receiver, each time reference being representative of a time of the transmitter clock at the transmission of the time reference. The method comprises the step of, for each time reference of a subset of the sequence, estimating a difference between the time reference and a time of the receiver clock corresponding to a reception of the time reference, wherein the difference is estimated based in part on a linear trend model of at least one previous difference between at least one previous time reference and a time of the receiver clock corresponding to a reception of each of the at least one previous time references. The method further comprises the steps of updating an intercept coefficient of the linear model based in part on a previous value of the intercept coefficient associated with a previously received time reference, a previous value of a slope coefficient of the linear model associated with the previously received time reference, and an error between an actual difference between the time reference and the time of the receiver clock at the reception of the time reference and the estimated difference, and updating a slope coefficient of the linear model based in part on the previous value of the slope coefficient, and the error between an actual difference and the estimated difference.

In accordance with another embodiment of the present invention, a phase-locked loop (PLL) for synchronizing a local clock to a reference clock is provided. The PLL comprises an oscillator being adapted to output a local frequency and a loop filter being adapted to, for each time reference of a sequence of time references of the reference clock, estimate a difference between the time reference and a time of the local clock corresponding to a reception of the time reference, wherein the difference is estimated based in part on a linear trend model of at least one previous difference between at least one previous time reference and a time of the receiver clock corresponding to a reception of each of the at least one previous time references. The loop filter is further adapted to update an intercept coefficient of the linear model based in part on a previous value of the intercept coefficient associated with a previous time reference of the sequence, a previous value of a slope coefficient of the linear model associated with the previous time reference, and an error between an actual difference between the time reference and a time of the local clock at the reception of the time reference and the estimated difference. The loop filter further is adapted to update a slope coefficient of the linear model based in part on the previous value of the slope coefficient, and the error between the actual difference and the estimated difference. The PLL further comprises an oscillator input conditioner operably connected to the loop filter and the oscillator and being adapted to modify the local frequency of the oscillator by a frequency offset based on the updated slope coefficient.

In a packet-switched network, a system for playout of data of a sequence of packets transmitted from a transmitter is provided in accordance with yet another embodiment of the present invention. The system comprises a data buffer being adapted to store a data payload of each packet of the sequence of packets, a timestamp buffer being adapted to store a transmitter timestamp of each packet of the sequence of packets, the transmitter timestamp being representative of a time of a clock of the transmitter at a transmission of the packet, and a playout module operably connected to the data buffer and the timestamp buffer and being adapted to direct an output of a data payload from the data buffer when a corresponding transmitter timestamp in the timestamp buffer is equivalent to a time of a local clock. The system further comprises a phased-lock loop (PLL) being adapted to provide the local clock and being further adapted to, for each packet of the sequence of packets, estimate a difference between a timestamp of the packet and a time of the local clock corresponding to a reception of the packet, wherein the difference is estimated based in part on a linear trend model of at least one previous difference between at least one previous time reference and a time of the receiver clock corresponding to a reception of each of the at least one previous time references. The PLL is further adapted to update an intercept coefficient of the linear model based in part on a previous value of the intercept coefficient associated with a previous packet of the sequence, a previous value of a slope coefficient of the linear model associated with the previous packet, and an error between an actual difference between the timestamp and the time of the local clock at reception of the time reference and the estimated difference. The PLL is additionally adapted to update the slope coefficient of the linear model based in part on the previous value of the slope coefficient, and the error between the actual difference and the estimated difference and modify a frequency of the local clock by a frequency offset based in part on the updated slope coefficient.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
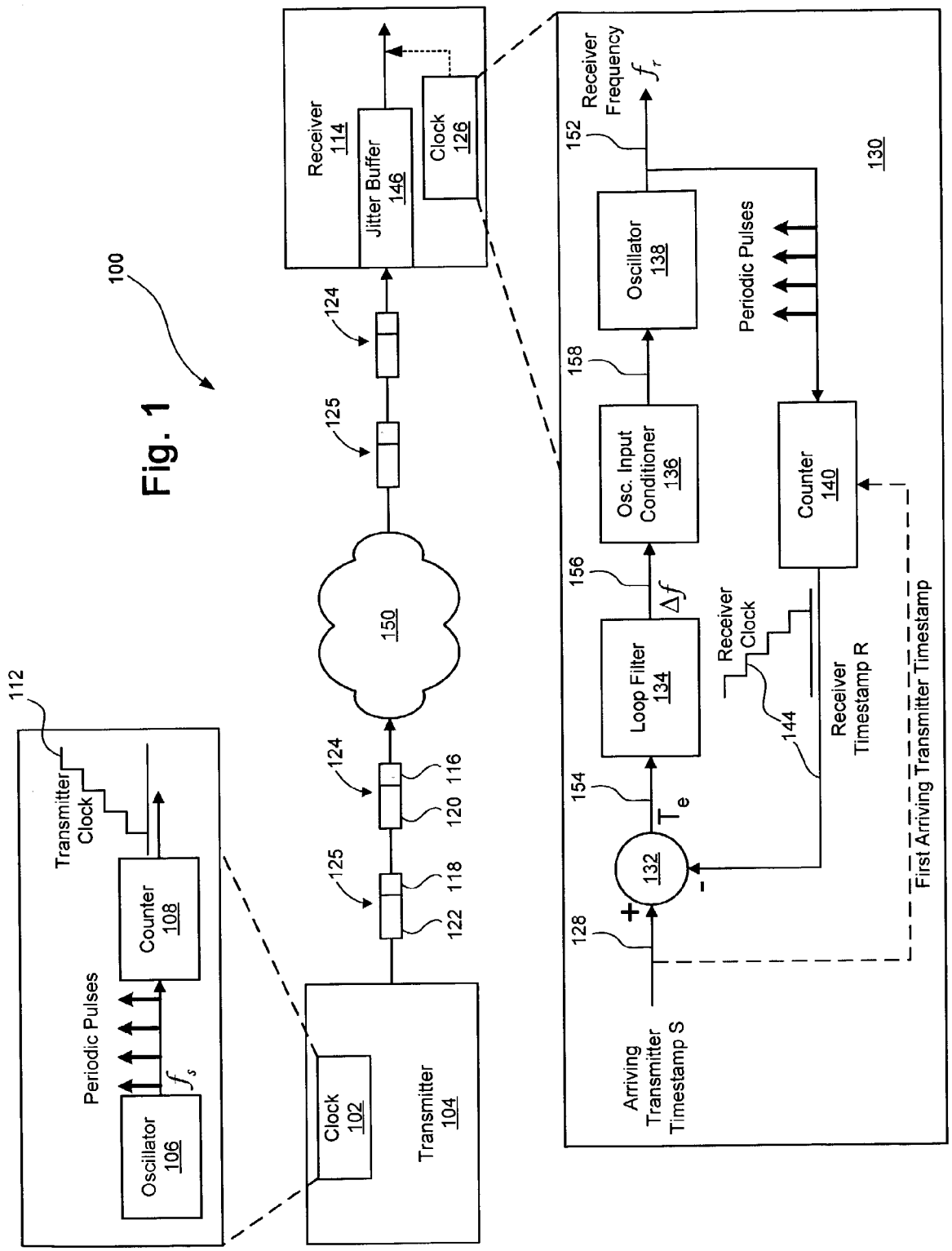
FIG. 1 is a schematic diagram illustrating an exemplary system having a phase-locked loop (PLL) for clock synchronization in accordance with at least one embodiment of the present invention.

FIGS. 1–6 illustrate exemplary techniques and systems for synchronizing a receiver clock with a transmitter clock using a linear model of the error between the transmitter clock and the receiver clock to estimate a frequency offset by which to adjust the frequency of an oscillator of the receiver clock. In at least one embodiment, the estimated frequency offset is determined based in part on a direct smoothing process of the coefficients of the linear model. Also described herein is a phased-lock loop (PLL) adapted to synchronize a local clock with a reference clock using the direct smoothing process, as well as a system implementing such a PLL for timing the playout of data received from a transmitter.

Clock synchronization techniques in accordance with at least one embodiment of the present invention can be used to synchronize the clocks of individual nodes in a network to a common reference, as a clock synchronization mechanism for circuit emulation services (CES) over packet networks, and the like. For example, to interwork circuit switched time-division multiplexing (TDM) networks through a packet switched network, the packet network generally is required to behave as a transparent "link" in the end-to-end path between the TDM networks. This transparent inclusion of a packet network in an end-to-end path of a connection that carries circuit-switched time-sensitive or TDM services often is referred to as "circuit emulation" on the packet network. CES allows a network operator to migrate network core infrastructure from circuit-switched TDM to packet-switched, while preserving the legacy circuit-switched TDM end equipment. A reliable and efficient clock synchronization scheme provides for the successful deployment of CES. A lack of synchronization traceability between TDM equipment interconnected over the packet network may result in frame or byte slips which can affect data integrity.

The present invention can be implemented in any of a variety of systems that benefit from clock synchronization. For instance, at least one embodiment of the present invention could be implemented as part of a networking protocol, such as the Real Time Protocol (RTP), used to transmit timing-sensitive data, such as multimedia or voice, over a packet-switched network. Various embodiments of the present invention can be implemented as hardware, software, or a combination thereof. For example, the various exemplary clock synchronization methods described below could be implemented, in whole or part, as sets of instructions adapted to manipulate a processor or other processing device to perform the described process. Alternatively, the exemplary methods could be implemented, for example, as an application specific integrated circuit (ASIC), a microcontroller, programmable logic, and the like.

The term "clock synchronization," as used herein, refers to frequency synchronization rather than time synchronization. Frequency synchronization may be understood to refer to the synchronization of the frequency of a local clock to the frequency of a reference clock, without requiring or expecting the local clock and reference clock to be equal in phase (i.e., equal in their time value with respect to an absolute time reference).

A transmitter and a receiver of data in a network typically each have their own time bases which are driven by the internal clocks that both sides use in the transmission and reception of data. The receiver can be adapted to synchronize its time base to that of the transmitter. Ideally, the transmitter and receiver operate at the same frequency. In reality, however, the oscillators typically used in the transmitter clock (i.e., the reference clock) and the receiver clock (i.e., the local clock) have some non-constant frequency deviation from their nominal oscillation frequency, and therefore these time bases are not always the same, resulting in substantial frequency offset.

To illustrate, let $S(t)$ and $R(t)$ denote the time bases of the transmitter and the receiver, respectively. These two functions correspond to the timestamps of the two clocks at discrete time instant t, where t=1, 2, 3, . . . . Generally there is a phase difference between the two time bases. Let also $f_s(t)$ and $f_r(t)$ denote the frequencies in cycles per second (Hertz) of the oscillator of the transmitter clock and the oscillator of the receiver clock, respectively.

A main purpose of most clock synchronization techniques is to estimate and compensate for the frequency offset (i.e., $f_s(t)-f_r(t)$) occurring between the oscillators of the transmitter clock and the receiver clock. Unfortunately, the presence of transmission jitter in the network affects the performance of typical clock estimation/compensation processes, making the transmitter clock appear to the receiver as being faster or slower than it actually is, ultimately causing the propagation of some residual jitter up to the receiver clock signal. The presence of even a modest amount of network jitter can make clock synchronization difficult.

The clock synchronization process may be stated as an estimation problem as follows. The receiver initializes its local clock to the first arriving transmitter timestamp, i.e., $R(0)=S(0)$. When the PLL of the receiver receives a new timestamp $S(t)$ it compares this with the local timestamp $R(t)$ to generate an error signal:

$$T_e(t)=S(t)-R(t) \quad \text{EQ. 1}$$

A sequence of observations on the variable $T_e(t)$ forms a time series. The time series on $T_e(t)$ up to the current time period (or sample) T can be modeled by the following linear trend model:

$$x(t)=T_e(t)=b_1+b_2 t+\epsilon(t), \, t=1, 2, \ldots, T \quad \text{EQ. 2}$$

where the coefficient $b_1$ represents the intercept (or the level at time t=0) of the linear model of EQ. 2, the coefficient $b_2$ represent the slope ($dT_e(t)/dt=b_2$) of the linear model, and $\epsilon(t)$ is a random component or "noise" in the process and includes all components such as clock noise, measurement noise, etc. Further, assume that this random component has mean $E[\epsilon(t)]=0$ and variance $Var[\epsilon(t)]=\sigma_\epsilon^2$, and is not serially correlated with random deviations at other times (i.e., $E[\epsilon(t)\epsilon(t+\psi)]=0$ for $\psi \neq 0$). Many processes or time series can be adequately described by this simple linear function of time t (EQ. 2). Note that in the clock synchronization problem summarized by the linear model of EQ. 2, the intercept coefficient $b_1$ represents the fixed time offset between the transmitter clock and the receiver clock, and the slope coefficient $b_2$ represents the frequency offset (i.e., the frequency deviation) of the receiver clock with respect to the transmitter clock. In other words:

$$b_2=f_s-f_r=\Delta f \quad \text{EQ. 3}$$

The mean of the time series process $x(t)=T_e(t)$ changes linearly with time, and at time t, the mean is $b_1+b_2 t$. However, the coefficients $b_1$ and $b_2$ are unknown. Accordingly, techniques have been developed to estimate the coefficients $b_1$ and $b_2$ using the method of least squares. An implementation of the least-squares method is described in the paper by R. Noro, M. Hamdi, and J. P. Hubaux, "Circuit Emulation over IP Networks," *IFIP 6$^{th}$ Inter. Workshop on Protocols for High-Speed Networks*, Salem, Mass., August 1999, pp. 187–201.

By estimating the frequency offset $\Delta f=\hat{b}_2$, the receiver clock frequency $f_r$ can be modified in order to reduce this offset to essentially zero, therefore setting the receiver clock frequency $f_r$ substantially equal to the transmitter clock frequency $f_s$. If $\hat{b}_2(T)$ is defined as the estimate of $b_2$ at the end of the most recent observation (or update) at time period T, then the receiver frequency can be updated as follows:

$$f_r(T)=f_r(T-1)+\hat{b}_2(T) \quad \text{EQ. 4}$$

The clock synchronization problem thus can be reduced to a linear regression analysis where the slope coefficient $\hat{b}_2=\Delta f$ is the coefficient to be determined from the time series of $T_e(t)$ values.

The model described above in EQ. 2 can be described in the general form:

$$x(t)=T_e(t)=b_1 z_1(t)+b_2 z_2(t)+\ldots+b_k z_k(t)+\epsilon(t) \quad \text{EQ. 5}$$

where $\{b_i\}$ are unknown coefficients, the $\{z_r(t)\}$ are independent variables and are mathematical functions of t, t=1, 2, . . . , T, and $\epsilon(t)$ is the random component. EQ. 5 often is referred to as a "multiple linear regression model". EQ. 2 is a specific form of EQ. 5 whereby $z_1(t)=1$ and $z_2(t)=t$.

Assume that there are k unknown coefficients to be estimated $b_1, b_2, \ldots, b_k$. Further assume that the general model is of the form of EQ. 5, and that there are n observations ($n \geq k$) on the dependent variable available. The model, written in terms of the observations, is:

$$x(j) = b_1 + b_2 z_{2j} + b_3 z_{3j} + \ldots + b_k z_{kj} + \varepsilon(j) \quad \text{EQ. 6}$$
$$= b_1 + \sum_{i=2}^{k} b_i z_{ij} + \varepsilon(j), \, j=1, 2, \ldots, n$$

where $z_{ij}$ denotes the jth level or value taken on by the ith independent variable with $z_{1j} \equiv 1$. For the following, the subscript j denotes the time period and is referenced as t.

It is convenient to express EQ. 6 in matrix notation. Let $\bar{x}$ be an n×1 column vector of the observations, $\bar{Z}$ be an n×k matrix of the independent variables, $\bar{b}$ be a k×1 column vector of the unknown parameters, and $\bar{\epsilon}$ be an n×1 column vector of the errors, that is:

$$\bar{x} = \begin{bmatrix} x(1) \\ x(2) \\ \vdots \\ x(n) \end{bmatrix} \quad \text{EQ. 7}$$

$$\bar{Z} = \begin{bmatrix} 1 & z_{21} & z_{31} & \cdots & z_{k1} \\ 1 & z_{22} & z_{32} & \cdots & z_{k2} \\ \vdots & \vdots & \vdots & \ddots & \vdots \\ 1 & z_{2n} & z_{3n} & \cdots & z_{kn} \end{bmatrix} \quad \text{EQ. 8}$$

$$\bar{b} = \begin{bmatrix} b_1 \\ b_2 \\ \vdots \\ b_k \end{bmatrix} \quad \text{EQ. 9}$$

$$\bar{\epsilon} = \begin{bmatrix} \varepsilon(1) \\ \varepsilon(2) \\ \vdots \\ \varepsilon(n) \end{bmatrix} \quad \text{EQ. 10}$$

Consequently, in matrix notation, the model of EQ. 6 may be represented as:

$$\bar{x} = \bar{Z}\bar{b} + \bar{\epsilon} \quad \text{EQ. 11}$$

EQ. 11 is often referred to as the "general linear model", as any functional relationship which is linear in the unknown parameters can be expressed in this form.

To estimate the vector of unknown coefficients $\bar{b}$ by least squares, certain assumptions may be made regarding the elements of the error vector $\bar{\epsilon}$. Specifically, it can be assumed that the expected value of the errors is zero, their variance is $\sigma_\epsilon^2$, and that the errors are uncorrelated. In matrix form, $E[\epsilon(t)] = 0$ for $t = 1, 2, \ldots, n$, may be written as:

$$E[\bar{\epsilon}] = \bar{0} \quad \text{EQ. 12}$$

where $\bar{0}$ represents an n×1 column vector of 0's. The variance and correlation assumptions on $\bar{\epsilon}$ may be summarized in the n×n covariance matrix:

$$\begin{bmatrix} \sigma_\epsilon^2 & 0 & 0 & \cdots & 0 \\ 0 & \sigma_\epsilon^2 & 0 & \cdots & 0 \\ \vdots & \vdots & \vdots & \ddots & \vdots \\ 0 & 0 & 0 & \cdots & \sigma_\epsilon^2 \end{bmatrix} \quad \text{EQ. 13}$$

The covariance matrix of $\bar{\epsilon}$ is an n×n matrix whose ith diagonal element is the variance of $\epsilon_i$, and whose (i, j)th off-diagonal element is the covariance between $\epsilon_i$ and $\epsilon_j$. In general, if $\epsilon_i$ and $\epsilon_j$ are two uncorrelated errors, then their covariance is zero, where the covariance is defined as:

$$Cov[\epsilon_i, \epsilon_j] = E[\epsilon_i - E[\epsilon_i]]E[\epsilon_j - E[\epsilon_j]] = E[\epsilon_i \epsilon_j] \quad \text{EQ. 14}$$

The covariance matrix of $\bar{\epsilon}$ may also be written as $\sigma_E^2 \bar{I}$, where $\bar{I}$ is an n×n identity matrix.

For a vector of estimates $\bar{b}'[\hat{b}_1, \hat{b}_2, \ldots, \hat{b}_k]$ the fitted model can be described as:

$$\hat{\bar{x}} = \bar{Z}\hat{\bar{b}} \quad \text{EQ. 15}$$

where $[\cdot]'$ denotes the transpose of a vector or matrix $[\cdot]$. The term "residual" refers to a difference between the fitted model and the actual data. Here the vector of residuals is:

$$\bar{e} = \bar{x} - \hat{\bar{x}} = \bar{x} - \bar{Z}\hat{\bar{b}} \quad \text{EQ. 16}$$

The least-squares estimator of $\bar{b}$ minimizes the sum of squares of the errors:

$$S_{SE} = \sum_{j=1}^{n} \varepsilon_j^2 \quad \text{EQ. 17}$$

which in matrix notation is:

$$S_{SE} = \bar{e}'\bar{e} = (\bar{x} - \bar{Z}\hat{\bar{b}})'(\bar{x} - \bar{Z}\hat{\bar{b}}) \quad \text{EQ. 18}$$

EQ. 18 can be written as:

$$S_{SE} = \bar{x}'\bar{x} - 2\hat{\bar{b}}'\bar{Z}'\bar{x} + \hat{\bar{b}}'\bar{Z}'\bar{Z}\hat{\bar{b}} \quad \text{EQ. 19}$$

In general, it is necessary that the least-squares estimator satisfy:

$$\left. \frac{\partial S_{SE}}{\partial \bar{b}} \right|_{\hat{\bar{b}}} = \bar{0} \quad \text{EQ. 20}$$

Therefore, differentiating EQ. 19 with respect to $\hat{\bar{b}}$, EQ. 21 can be obtained:

$$-2\bar{Z}'\bar{x} + 2\bar{Z}'\bar{Z}\hat{\bar{b}} = \bar{0} \quad \text{EQ. 21}$$

and thus the least squares equation satisfies:

$$\bar{Z}'\bar{Z}\hat{\bar{b}} = \bar{Z}'\bar{x} \quad \text{EQ. 22}$$

The solution to the simultaneous equation EQ. 22 (i.e., the least-squares estimator) is:

$$\hat{\bar{b}} = (\bar{Z}'\bar{Z})^{-1}\bar{Z}'\bar{x} \quad \text{EQ. 23}$$

if $(\bar{Z}'\bar{Z})^{-1}$ exists. The verification of the bias and variance properties of the least-square estimator $\hat{\bar{b}}$ is relatively straightforward. The bias can be determined as follows:

$$\begin{aligned} E[\hat{\bar{b}}] &= E[(\bar{Z}'\bar{Z})^{-1}\bar{Z}'\bar{x}] \quad \text{EQ. 24} \\ &= (\bar{Z}'\bar{Z})^{-1}\bar{Z}'E[\bar{x}] \\ &= (\bar{Z}'\bar{Z})^{-1}\bar{Z}'E[\bar{Z}\bar{b} + \bar{\epsilon}] \\ &= (\bar{Z}'\bar{Z})^{-1}\bar{Z}'\bar{Z}\bar{b} + (\bar{Z}'\bar{Z})^{-1}\bar{Z}'E[\bar{\epsilon}] \\ &= \bar{b} \end{aligned}$$

since $E[\bar{\epsilon}]=\bar{0}$ and $(\bar{Z}'\bar{Z})^{-1}\bar{Z}'\bar{Z}=\bar{I}$. Letting $\bar{G}=\bar{Z}'\bar{Z}$ for convenience, the covariance matrix of the least-squares estimator (EQ. 23) follows:

$$\bar{V} = E\left[(\hat{\bar{b}}-\bar{b})(\hat{\bar{b}}-\bar{b})'\right] \quad \text{EQ. 25}$$

$$= E\left\{[\bar{G}^{-1}\bar{Z}'\bar{x} - \bar{G}^{-1}\bar{Z}'E[\bar{x}]][\bar{G}^{-1}\bar{Z}'\bar{x} - \bar{G}^{-1}\bar{Z}'E[\bar{x}]]'\right\}$$

$$= E\{\bar{G}^{-1}\bar{Z}'[\bar{x} - E[\bar{x}]][\bar{x} - E[\bar{x}]]'[\bar{G}^{-1}\bar{Z}']'\}$$

$$= \bar{G}^{-1}\bar{Z}'E[\bar{\epsilon}\bar{\epsilon}']\bar{Z}\bar{G}^{-1} = \bar{G}^{-1}\sigma_\epsilon^2$$

since $E[\bar{\epsilon}\bar{\epsilon}']=\sigma_\epsilon^2\bar{I}$ and $\bar{G}^{-1}$ is a symmetric matrix. The error variance may be estimated by:

$$\hat{\sigma}_\epsilon^2 = \frac{(\bar{x}-\hat{\bar{x}})'(\bar{x}-\hat{\bar{x}})}{n-k} = \frac{\bar{e}'\bar{e}}{n-k} \quad \text{EQ. 26}$$

It can be shown that $\hat{\sigma}_\epsilon^2$ is an unbiased estimator of $\sigma_\epsilon^2$.

Now consider the application of the above results to the linear model of EQ. 2. Assume that there are T periods of data available (i.e., $x_1, x_2, \ldots, x_T$). The estimators of $b_1$ and $b_2$ are $\hat{b}_1$ and $\hat{b}_2$, respectively. The fitted model is:

$$\bar{x}(t) = \hat{b}_1 + \hat{b}_2 t \quad \text{EQ. 27}$$

To estimate $b_1$ and $b_2$ by the method of least squares, the estimators $\hat{b}_1$ and $\hat{b}_2$ typically are chosen so that the error sum of squares (EQ. 28) is minimized.

$$S_{SE} = \sum_{t=1}^{T}(x(t) - \hat{b}_1 - \hat{b}_2 t)^2 \quad \text{EQ. 28}$$

Therefore, $\hat{b}_1$ and $\hat{b}_2$ should satisfy EQs. 29 and 30.

$$\left.\frac{\partial S_{SE}}{\partial b_1}\right|_{\hat{b}_1,\hat{b}_2} = 0 \quad \text{EQ. 29}$$

$$\left.\frac{\partial S_{SE}}{\partial b_2}\right|_{\hat{b}_1,\hat{b}_2} = 0 \quad \text{EQ. 30}$$

Applying the results from above and noting that $\bar{Z}$ in this case is a T×2 matrix, the following EQs. 31–33 can be determined:

$$\bar{Z} = \begin{bmatrix} 1 & 1 \\ 1 & 2 \\ \vdots & \vdots \\ 1 & T \end{bmatrix} \quad \text{EQ. 31}$$

$$\bar{x} = \begin{bmatrix} x(1) \\ x(2) \\ \vdots \\ x(T) \end{bmatrix} \quad \text{EQ. 32}$$

$$\hat{\bar{b}} = \begin{bmatrix} \hat{b}_1 \\ \hat{b}_2 \end{bmatrix} \quad \text{EQ. 33}$$

The 2×2 matrix $\bar{Z}'\bar{Z}$ and its inverse are given, respectively, as:

$$\bar{Z}'\bar{Z} = \begin{bmatrix} \sum_{t=1}^{T}(1)^2 & \sum_{t=1}^{T} t \\ \sum_{t=1}^{T} t & \sum_{t=1}^{T} t^2 \end{bmatrix} = \begin{bmatrix} T & \frac{T(T+1)}{2} \\ \frac{T(T+1)}{2} & \frac{T(T+1)(2T+1)}{6} \end{bmatrix} \quad \text{EQ. 34}$$

$$(\bar{Z}'\bar{Z})^{-1} = \begin{bmatrix} \frac{2(2T+1)}{T(T-1)} & \frac{-6}{T(T-1)} \\ T(T-1) & T(T^2-1) \end{bmatrix} \quad \text{EQ. 35}$$

using the well-known results $$\sum_{t=1}^{T} t = T(T+1)/2$$

and $$\sum_{t=1}^{T} t^2 = T(T+1)(2T+1)/6.$$

The vector $\bar{Z}'\bar{x}$ can be shown to be:

$$\bar{Z}'\bar{x} = \begin{bmatrix} \sum_{t=1}^{T} x(t) \\ \sum_{t=1}^{T} tx(t) \end{bmatrix} \quad \text{EQ. 36}$$

If the linear model of EQ. 2 adequately describes the data, then estimate $\sigma_\epsilon^2$ can be estimated as:

$$\sigma_\epsilon^2 = \frac{\sum_{t=1}^{T}(x(t)-\hat{x}(t))^2}{T-2} \quad \text{EQ. 37}$$

EQ. 23 then may be solved for the estimators $\hat{b}_1$ and $\hat{b}_2$ to obtain:

$$\hat{b}_1 = \frac{2(2T+1)}{T(T-1)}\sum_{t=1}^{T} x(t) - \frac{6}{T(T-1)}\sum_{t=1}^{T} tx(t) \quad \text{EQ. 38}$$

$$\hat{b}_2 = \frac{12}{T(T^2-1)}\sum_{t=1}^{T} tx(t) - \frac{6}{T(T-1)}\sum_{t=1}^{T} x(t) \quad \text{EQ. 39}$$

The estimators $\hat{b}_1$ and $\hat{b}_2$ depend on the point in time T at which they are computed. Therefore, it may be convenient to denote the estimators $\hat{b}_1$ and $\hat{b}_2$ as a function of time, such as $\hat{b}_1(T) \equiv \hat{b}_1$ and $\hat{b}_2(T) \equiv \hat{b}_2$, where T is the time at which the estimates are computed.

Using $\hat{b}_1(T)$ and $\hat{b}_2(T)$, the estimate made at the end of period T of an observation in some future time period, say T+τ, τ=1, 2, 3, . . . , can be denoted by $\hat{x}_{T+\tau}(T)$, and is calculated from:

$$\hat{x}_{T+\tau}(T) = \hat{b}_1(T) + \hat{b}_2(T) \cdot [T+\tau] \qquad \text{EQ. 40}$$

The estimate for the period T+τ is a projection of the fitted model. As new observations become available, updated estimates of the model coefficients may be computed. In one embodiment, the direct smoothing process includes estimating the unknown coefficients in the appropriate process model and then using these estimates to project the model into the future to obtain an estimate/prediction of the clock offset between the transmitter clock and the receiver clock at time T.

As discussed above, the linear model of EQ. 2 can be used to determine the frequency offset Δf by which the oscillator of the local clock is to be adjusted to synchronize the local clock with the reference clock. In such a case, the desired frequency offset Δf can be shown to be represented by the model coefficient $b_2$ of the linear model of EQ. 2 (i.e., $\Delta f = b_2$).

In order to decrease the storage requirements for the time series $T_e(t)$ and/or decrease the required processing effort compared to known techniques for estimating the coefficients $\hat{b}_1$ and $\hat{b}_2$, at least one embodiment of the present invention provides a technique for estimating the frequency offset Δf (i.e., estimating the coefficient $b_2$ of EQ. 2) based in part on a direct smoothing process of a subset of a sequence of observations (i.e., the reception of timestamps at the receiver). This technique, in effect, smoothes the old coefficient estimates with the current period's estimation error to obtain updated estimates of the coefficients $\hat{b}_1$ and $\hat{b}_2$. Unlike least squares linear regression analysis techniques, the exemplary smoothing processes discussed herein use a weighted least-squares criterion in which the squared errors are discounted with age. The implementation of an exemplary direct smoothing process using the linear model of EQ. 2 follows.

The time series {x(t)} represented by the general model in EQ. 5 can be rewritten as:

$$x(t) = \sum_{i=1}^{k} b_i z_i(t) + \varepsilon(t), \quad t = 1, 2, 3, \ldots, T \qquad \text{EQ. 41}$$

with the requirement that there are at least as many observations as independent variables, that is, T≥k. Let also $\bar{z}(t)$ denote the k×1 column vector whose ith element is the ith independent variable $z_i(t)$. Then EQ. 41 may be written in matrix notation as:

$$x(t) = \bar{z}'(t)\bar{b} + \epsilon(t), t=1, 2, \ldots, T \qquad \text{EQ. 42}$$

The fitted model is:

$$\hat{x}(t) = \bar{z}'(t)\hat{\bar{b}} = \sum_{i=1}^{k} \hat{b}_i z_i(t) \qquad \text{EQ. 43}$$

and the tth residual is:

$$e(t) = x(t) - \hat{x}(t) = \bar{x}(t) - \bar{z}'(t)\hat{\bar{b}} \qquad \text{EQ. 44}$$

Observations that are close to the current time period T may be of more importance in estimating $\bar{b}$ than observations realized in the distant past, as the recent data may be more indicative of the true behavior of the process. In such situations, it is beneficial to discount the errors away from the current time period so that older observations receive proportionally less weight. Therefore the estimator of $\bar{b}$ that minimizes the discounted, or weighted, sum of squares of the errors may be sought using:

$$S_{SE} = \sum_{t=1}^{T} W_{tt}^2 \varepsilon^2(t) \qquad \text{EQ. 45}$$

where $W_{tt}$ is the square root of the weight given to the tth error. The process of determining estimators $\bar{b}$ which minimize EQ. 45 is referred to as the method of "discounted least squares" (see, e.g., R. G. Brown, *Smoothing, Forecasting, and Prediction of Discrete Time Series*, Prentice-Hall, New Jersey, 1963).

Note that $\bar{x}$ can be redefined as an T×1 column vector of the observations, $\bar{\epsilon}$ can be redefined as an T×1 column vector of the model error components, and $\bar{Z}$ can be redefined as a T×k matrix of the independent variables such that:

$$\bar{Z}(T) = \begin{bmatrix} z_1(1) & z_2(1) & \ldots & z_k(1) \\ z_1(2) & z_2(2) & \ldots & z_k(2) \\ \vdots & \vdots & \ddots & \vdots \\ z_1(T) & z_2(T) & \ddots & z_k(T) \end{bmatrix} \qquad \text{EQ. 46}$$

That is, the tth row of $\bar{Z}$ (T) represents the level of the independent variables corresponding to the tth observation x(t). The model (EQ. 43) can now be expressed as $$\bar{x} = \bar{Z}(T)\bar{b} + \bar{\epsilon} \qquad \text{EQ. 47}$$

The weighted sum of squared errors is:

$$\begin{aligned} S_{SE} &= (\bar{W}\bar{\varepsilon})'(\bar{W}\bar{\varepsilon}) \qquad \text{EQ. 48} \\ &= \bar{\varepsilon}' \bar{W}' \bar{W} \bar{\varepsilon} \\ &= \bar{\varepsilon}' \bar{W}^2 \bar{\varepsilon} \\ &= [\bar{x} - \bar{Z}(T)\bar{b}]' \bar{W}^2 [\bar{x} - \bar{Z}(T)\bar{b}] \\ &= \bar{x}' \bar{W}^2 \bar{x} - 2\bar{b}' \bar{Z}'(T) \bar{W}^2 \bar{x} + \bar{b}' \bar{Z}'(T) \bar{W}^2 \bar{Z}(T) \bar{b} \end{aligned}$$

where $\bar{W}$ is the T×T diagonal matrix of the square roots of the weights $$\bar{W} = \begin{bmatrix} W_{11} & 0 & \ldots & 0 \\ 0 & W_{22} & \ldots & 0 \\ \vdots & \vdots & \ddots & \vdots \\ 0 & 0 & \ldots & W_{TT} \end{bmatrix} \qquad \text{EQ. 49}$$

The discounted least-squares estimator computed at the end of period T, say $\bar{b}(T)$, preferably satisfy:

$$\frac{\partial S_{SE}}{\partial \bar{b}}\bigg|_{\hat{b}} = -2\bar{Z}'(T)\overline{W}^2\bar{x} + 2\bar{Z}'(T)\overline{W}^2\bar{Z}(T)\hat{\bar{b}}(T) = \bar{0} \qquad \text{EQ. 50}$$

Therefore, the least-squares equations can be defined as:

$$\bar{Z}(T)\overline{W}^2\bar{Z}(T)\bar{b}(T) = \bar{Z}'(T)\overline{W}^2\bar{x} \qquad \text{EQ. 51}$$

or $$\bar{G}(T)\bar{b}(T) = \bar{g}(T) \qquad \text{EQ. 52}$$

where $\bar{G}(T) = [\overline{WZ}(T)]'[\overline{WZ}(T)]$ is a k×k matrix consisting of weighted sums of the squares and cross products of the independent variables computed at time T and $\bar{g}(T) = \bar{Z}'(T)\overline{W}^2\bar{x}$ is a k×1 column vector of weighted sums of products of the independent variables computed at time T. In scalar notation, the elements of $\bar{G}(T)$ are:

$$G_{ij}(T) = \sum_{t=1}^{T} W_{tt}^2 z_i(t) z_j(t) \text{ for } i, j = 1, 2, \ldots, k \qquad \text{EQ. 53}$$

and the elements of $\bar{g}(T)$ are:

$$g_i(T) = \sum_{t=1}^{T} W_{tt}^2 x(t) z_i(t) \text{ for } i = 1, 2, \ldots, k \qquad \text{EQ. 54}$$

If the matrix $\bar{G}(T)^{-1}$ exits, the solution of the simultaneous equations (EQ. 52) is:

$$\bar{b}(T) = \bar{G}(T)^{-1}\bar{g}(T) \qquad \text{EQ. 55}$$

Discounted least-squares estimators often have several useful statistical properties. It is relatively straightforward to show that $\bar{b}(T)$ is unbiased, whereby:

$$E[\bar{b}(T)] = \bar{b} \qquad \text{EQ. 56}$$

and that the covariance matrix of $\bar{b}(T)$ is:

$$\bar{V} \equiv E\left[\hat{\bar{b}}(T) - \bar{b}\right]\left[\hat{\bar{b}}(T) - \bar{b}\right]' \qquad \text{EQ. 57}$$
$$= \bar{G}(T)^{-1}\bar{F}(T)\bar{G}(T)^{-1}\sigma_\varepsilon^2$$

where the matrix $\bar{F}(T)$ is defined as:

$$\bar{F}(T) = \bar{Z}'(T)\overline{W}^4\bar{Z}(T) \qquad \text{EQ. 58}$$

Note that $\bar{V}$ is a function of T.

Although the discounted least-squares linear regression technique discussed above may be utilized in accordance with at least one embodiment of the present invention to determine the frequency offset $\Delta f$, it will be appreciated that the estimates of the model coefficients $\bar{b}$ generally would need to be revised at the end of each time period to take into account new data. Solving EQ. 55 at the end of every time period would involve recomputing $\bar{G}(T)^{-1}$ every period. The computations associated with finding $\bar{G}(T)^{-1}$ may be prohibitive in the event that a large number of time series was being analyzed. Likewise, the storage requirements for storing the large number of time series may also be prohibitive.

Accordingly, in at least one embodiment of the present invention, a direct smoothing process is utilized to reduce the number of calculations to be performed and/or reduce the storage requirements of the time series $T_e(t)$. Direct smoothing (also referred to as "adaptive smoothing") typically is a relatively efficient method for updating the model coefficients that does not require $\bar{G}(T)^{-1}$ to be computed every time period, provided that the model utilizes certain types of independent variables and weights (see, e.g., R. G. Brown, *Smoothing, Forecasting, and Prediction of Discrete Time Series*, Prentice-Hall, New Jersey, 1963). The direct smoothing process discussed herein in accordance with at least one embodiment smoothes the previous estimates of the model coefficients $b_1$ and $b_2$ based in part on the estimation error for the current period to obtain updated/revised estimates.

In the following derivation, it is convenient to have the origin of time for the model to be the end of the current period T. This will require that the origin of time be shifted each period. To accomplish this, let the discounted least-squares criterion at the end of any period T be:

$$S_{SE} = \sum_{j=0}^{T-1} W_{T-j,T-j}^2 [x(T-j) - \bar{z}'(-j)\bar{b}(T)]^2 \qquad \text{EQ. 59}$$

Here, it is desirable to determine the estimator $\bar{b}$ that minimizes $S_{SE}$. The index (T−j) on the observation x denotes the calendar time period associated with the observation, the argument T in $\bar{b}(T)$ indicates the calendar time period considered to be the origin of time, and $\bar{z}(-j)$ indicates that the mathematical functions of time $\bar{z}$ are to be evaluated at (−j). Let also the weights $W_n^2$ be defined as:

$$W_{T-j,T-j}^2 = \beta^j, j=0, 1, \ldots, T-1 \qquad \text{EQ. 60}$$

where the discount factor $\beta$ is chosen so that $0 < \beta < 1$. Notice that this is equivalent to choosing the matrix of weights in the discounted least-squares process to be the T×T diagonal matrix:

$$\overline{W}^2 = \begin{bmatrix} \beta^{T-1} & 0 & \cdots & 0 & 0 \\ 0 & \beta^{T-2} & \cdots & 0 & 0 \\ \vdots & \vdots & \ddots & \vdots & \vdots \\ 0 & 0 & \cdots & \beta & 0 \\ 0 & 0 & \cdots & 0 & 1 \end{bmatrix} \qquad \text{EQ. 61}$$

Therefore, the regression equations to be solved at the end of each time period are based on:

$$S_{SE} = \sum_{j=0}^{T-1} \beta^j [x(T-j) - \bar{z}'(-j)\bar{b}(T)]^2 \qquad \text{EQ. 62}$$

Further assume that the independent variables $z_i(t)$ are mathematical functions of time such that their values at time period t+1 are linear combinations of the same functions evaluated at the previous time t. Therefore:

$$z_i(t+1)=L_{i1}z_1(t)+L_{i2}z_2(t)+\ldots+L_{ik}z_k(t), \quad i=1, 2, \ldots k \quad \text{EQ. 63}$$

If $\bar{L}$ represents the k×k matrix of the $L_{ij}$, EQ. 63 can be written as:

$$\bar{z}(t+1)=\bar{L}\bar{z}(t) \quad \text{EQ. 64}$$

The only functions of time for which the transition property in EQ. 64 exists are polynomial, exponential, and trigonometric functions. Also, note that given the matrix $\bar{L}$ and $\bar{z}(0)$, $\bar{z}(t)$ can be defined as:

$$\bar{z}(t)=\bar{L}\bar{z}(0) \quad \text{EQ. 65}$$

To develop the direct smoothing equations for a particular polynomial model, the transition matrix $\bar{L}$ is constructed. The transition matrix $\bar{L}$ can be determined from an inspection of the terms in the model. For example, consider the linear trend model in EQ. 2 for which $z_1(t)=1$ and $z_2(t)=t$. For this model it can be verified that:

$$\bar{L} = \begin{bmatrix} 1 & 0 \\ 1 & 1 \end{bmatrix} \quad \text{EQ. 66}$$

Considering the matrix $\bar{G}(T)$, note that:

$$\bar{G}(T) = \sum_{j=0}^{T-1} \beta^j \bar{z}(-j)\bar{z}'(-j) = \quad \text{EQ. 67}$$

$$\bar{G}(T-1) + \beta^{T-1}\bar{z}(-T+1)\bar{z}'(-T+1)$$

It can be shown that if the functions $\{z_i(t)\}$ decay relatively slowly, the matrix $\bar{G}(T)$ approaches a limit $\bar{G}$, where:

$$\bar{G} \equiv \lim_{T \to \infty} \bar{G}(T) = \sum_{j=0}^{\infty} \beta^j \bar{z}(-j)\bar{z}'(-j) \quad \text{EQ. 68}$$

Therefore $\bar{G}^{-1}$ need to be computed only once. It can be demonstrated that a steady-state $\bar{G}$ generally exists if $z_i(t)$ are trigonometric or polynomial functions. If $z_i(t)=e^{-\theta t}$, then it is necessary that $\beta<e^{-2\theta}$.

The right-hand side of EQ. 52 may be written as:

$$\bar{g}(T) = \sum_{j=0}^{T-1} \beta^j x(T-j)\bar{z}(-j) \quad \text{EQ. 69}$$

$$= x(T)\bar{z}(0) + \sum_{j=1}^{T-1} \beta^j x(T-j)\bar{z}(-j)$$

$$= x(T)\bar{z}(0) + \beta \sum_{j=1}^{T-1} \beta^{j-1} x(T-j)\bar{L}^{-1}\bar{z}(-j+1)$$

$$= x(T)\bar{z}(0) + \beta\bar{L}^{-1} \sum_{k=0}^{T-2} \beta^k x(T-1-k)\bar{z}(-k)$$

or:

$$\bar{g}(T)=x(T)\bar{z}(0)+\beta\bar{L}^{-1}\bar{g}(T-1) \quad \text{EQ. 70}$$

Therefore, it is possible to obtain $\bar{g}(T)$ directly from $\bar{g}(T-1)$.

Using the steady-state value for $\bar{G}(T)$, the estimator of $\bar{b}(T)$ may be written as:

$$\bar{b}(T)=\bar{G}^{-1}\bar{g}(T)=\bar{G}^{-1}[x(T)\bar{z}(0)+\beta\bar{L}^{-1}\bar{g}(T-1)] \quad \text{EQ. 71}$$

However, since $\bar{G}\bar{b}(T-1)=\bar{g}(T-1)$, EQ. 71 becomes:

$$\bar{b}(T)=x(T)\bar{G}^{-1}\bar{z}(0)+\beta\bar{G}^{-1}\bar{L}^{-1}\bar{G}\bar{b}(T-1) \quad \text{EQ. 72}$$

which may be written as:

$$\bar{b}(T)=\bar{h}x(T)+\bar{H}\bar{b}(T-1) \quad \text{EQ. 73}$$

where:

$$\bar{h}=\bar{G}^{-1}\bar{z}(0) \quad \text{EQ. 74}$$

and $$\bar{H}=\beta\bar{G}^{-1}\bar{L}^{-1}\bar{G} \quad \text{EQ. 75}$$

It is possible to further simplify EQ. 73. Notice that:

$$\bar{L}^{-1}\bar{G} = \bar{L}^{-1}\bar{G}(\bar{L}')^{-1}\bar{L}' \quad \text{EQ. 76}$$

$$= \sum_{j=0}^{\infty} \beta^j \bar{L}^{-1}\bar{z}(-j)\bar{z}'(-j)(\bar{L}')^{-1}\bar{L}'$$

$$= \sum_{j=0}^{\infty} \beta^j [\bar{L}^{-1}\bar{z}(-j)][\bar{L}^{-1}\bar{z}(-j)]'\bar{L}'$$

$$= \sum_{j=0}^{\infty} \beta^j \bar{z}(-j-1)\bar{z}'(-j-1)\bar{L}'$$

If p=j+1, EQ. 77 is obtained.

$$\bar{L}^{-1}\bar{G} = \beta^{-1} \sum_{p=1}^{\infty} \beta^p \bar{z}(-p)\bar{z}'(-p)\bar{L}' \quad \text{EQ. 77}$$

$$= \beta^{-1}[\bar{G} - \bar{z}(0)\bar{z}'(0)]\bar{L}'$$

Therefore, substituting for $\bar{L}^{-1}\bar{G}$ in EQ. 75, EQ. 78 is obtained.

$$\bar{H} = \beta\bar{G}^{-1}\beta^{-1}[\bar{G} - \bar{z}(0)\bar{z}'(0)]\bar{L}' \quad \text{EQ. 78}$$

$$= \bar{G}^{-1}[\bar{G} - \bar{z}(0)\bar{z}'(0)]\bar{L}'$$

$$= [\bar{I} - \bar{G}^{-1}\bar{z}(0)\bar{z}'(0)]\bar{L}'$$

Since $\bar{h}=\bar{G}^{-1}\bar{z}(0)$:

$$\bar{H} = \bar{L}' - \bar{h}\bar{z}'(0)\bar{L}' \quad \text{EQ. 79}$$

$$= \bar{L}' - \bar{h}[\bar{L}\bar{z}(0)]'$$

$$= \bar{L}' - \bar{h}\bar{z}'(1)]$$

Accordingly, EQ. 73 can be written as:

$$\hat{\bar{b}}(T) = \bar{h}x(T) + [\bar{L}' - \bar{h}\bar{z}'(1)]\hat{\bar{b}}(T-1)$$
$$= \bar{L}'\hat{\bar{b}}(T-1) + \bar{h}[x(T) - \bar{z}'(1)\hat{\bar{b}}(T-1)]$$

EQ. 80

Let $\hat{x}_T(T-1)$ be the estimate for period T, made at the end of period T−1. Thus, since:

$$\hat{x}_T(T-1) = \bar{z}'(1)\bar{b}(T-1)]$$

EQ. 81

EQ. 80 becomes:

$$\bar{b}(T) = \bar{L}'\bar{b}(T-1) + \bar{h}[x(T) - \hat{x}_T(T-1)]$$

EQ. 82

The quantity $[x(T) - \hat{x}_T(T-1)]$ in EQ. 82 is just the single-period estimation error, or:

$$e_1(T) = x(T) - \bar{z}'(1)\bar{b}(T-1)$$

EQ. 83

The above derivation shows that the discounted least-squares estimates of the model coefficients at the end of period T are linear combinations of the estimates made at the end of the previous period and the single-period estimation error, that is:

$$\bar{b}(T) = \bar{L}'\bar{b}(T-1) + \bar{h}e_1(T)$$

EQ. 84

The estimates of the model coefficients $b_1$ and $b_2$, in one embodiment, are modified each period for at least two reasons. The first reason is to shift the origin of time to the end of the current period, and the second reason is to update or modify the estimates $\hat{b}_1$ and $\hat{b}_2$ according to the estimation error for the current period. These two purposes can be accomplished by the first and second terms, respectively, of EQ. 84. The k×1 vector $\bar{h}$ is sometimes referred to as the "smoothing vector".

The estimate for any future time period, say T+τ, made at the end of period T could be written as:

$$\hat{x}_{T+\tau}(T) = \bar{z}'(\tau)\hat{\bar{b}}(T) = \sum_{i=1}^{k} \hat{b}_1(T)z_1(\tau)$$

EQ. 85

To start the procedure, an initial estimate $\bar{b}(0)$ generally is required. The initial estimate $\bar{b}(0)$ could be a subjective estimate, it could be obtained by least-squares analysis of historical data, initialized to zero, and the like.

The variability of the estimator $\bar{b}(T)$ may be expressed by the covariance matrix:

$$\bar{V} = \bar{G}^{-1}\bar{F}\bar{G}^{-1}\sigma_\varepsilon^2$$

EQ. 86 where $$\bar{F} = \sum_{j=0}^{\infty} \beta^{2j}\bar{z}(-j)\bar{z}'(-j)$$

EQ. 87

It is also possible to express the variance of the estimate generated from EQ. 85 as:

$$\text{Var}[\hat{x}_{T+\tau}(T)] = \text{Var}[\bar{z}'(\tau)\hat{\bar{b}}(T)]$$
$$= \sum_{i=1}^{k}\sum_{j=1}^{k} z_i(\tau)_j(\tau)\text{Cov}[\hat{b}_i(T), \hat{b}_j(T)]$$
$$= \bar{z}'(\tau)\bar{V}\bar{z}'(\tau)$$

EQ. 89

The variance of the τ-step-ahead prediction error is:

$$\text{Var}[e_\tau(T+\tau)] = \text{Var}[x(T+\tau) - \hat{x}_{T+\tau}(T)]$$
$$= \sigma_\varepsilon^2 + \text{Var}[\hat{x}_{T+\tau}(T)]$$
$$= \sigma_\varepsilon^2 + \bar{z}'(\tau)\bar{V}\bar{z}'(\tau)$$

EQ. 89

As discussed above, the coefficients of the linear trend model of EQ. 2 can be estimated to determine a frequency offset by which to modify the frequency of the local clock of a transmitter. For this model, it is assumed that $z_1(t) \equiv 1$ and $z_2(t) \equiv t$ or:

$$\bar{z}(t) = \begin{bmatrix} 1 \\ t \end{bmatrix}$$

EQ. 90

The updating equations for the coefficients $\hat{b}_1$ and $\hat{b}_1$ may be described as:

$$\begin{bmatrix} \hat{b}_1(T) \\ \hat{b}_2(T) \end{bmatrix} = \begin{bmatrix} 1 & 1 \\ 0 & 1 \end{bmatrix}\begin{bmatrix} \hat{b}_1(T-1) \\ \hat{b}_2(T-1) \end{bmatrix} + \begin{bmatrix} h_1 \\ h_2 \end{bmatrix}e_1(T)$$

EQ. 91 which in scalar notation is:

$$\hat{b}(T) = \hat{b}(T-1) + \hat{b}_2(T-1) + h_1 e_1(T)$$

EQ. 92

$$\hat{b}_2(T) = \hat{b}_2(T-1) + h_2 e_1(T)$$

EQ. 93

Here, the estimators of $b_1$ and $b_2$ in the linear trend model (EQ. 2) are $\hat{b}_1(T)$ and $\hat{b}_2(T)$, respectively, where T is the time at which the estimates are computed. The elements of the smoothing vector $\bar{h}$ may be determined from EQ. 74. Therefore, the steady-state matrix $\bar{G}$ is to be determined. Notice that:

$$\bar{G}(T) = \sum_{j=0}^{T-1} \beta^j \bar{z}(-j)\bar{z}'(-j)$$

$$= \sum_{j=0}^{T-1} \beta^j \begin{bmatrix} 1 \\ -j \end{bmatrix}[1 \; -j]$$

$$= \sum_{j=0}^{T-1} \beta^j \begin{bmatrix} 1 & -j \\ -j & j^2 \end{bmatrix}$$

EQ. 94

Since it is known that:

$$\sum_{J=0}^{T-1} \beta^j = \frac{1-\beta^T}{1-\beta} \qquad \text{EQ. 95}$$

$$\sum_{J=0}^{T-1} j\beta^j = \frac{\beta(1-\beta^T)}{(1-\beta)^2} \qquad \text{EQ. 96}$$

and $$\sum_{J=0}^{T-1} j^2 \beta^j = \frac{\beta(1+\beta)(1-\beta^T)}{(1-\beta)^3} \qquad \text{EQ. 97}$$

$\overline{G}(T)$ may be expressed in closed form as:

$$\overline{G}(T) = (1-\beta^T) \begin{bmatrix} \frac{1}{1-\beta} & \frac{-\beta}{(1-\beta)^2} \\ \frac{-\beta}{(1-\beta)^2} & \frac{\beta(1+\beta)}{(1-\beta)^3} \end{bmatrix} \qquad \text{EQ. 98}$$

Therefore, the steady-state value of $\overline{G}(T)$ is:

$$\overline{G} \equiv \lim_{T \to \infty} \overline{G}(T) = \begin{bmatrix} \frac{1}{1-\beta} & \frac{-\beta}{(1-\beta)^2} \\ \frac{-\beta}{(1-\beta)^2} & \frac{\beta(1+\beta)}{(1-\beta)^3} \end{bmatrix} \qquad \text{EQ. 99}$$

and the inverse of $\overline{G}$ is:

$$\overline{G}^{-1} = \begin{bmatrix} 1-\beta^2 & (1-\beta)^2 \\ (1-\beta)^2 & \frac{(1-\beta)^3}{\beta} \end{bmatrix} \qquad \text{EQ. 100}$$

The elements of the smoothing vector are found by substituting $\overline{G}^{-1}$ and $\overline{z}(0)$ into EQ. 74 as:

$$\overline{h} = \begin{bmatrix} 1-\beta^2 & (1-\beta)^2 \\ (1-\beta)^2 & \frac{(1-\beta)^3}{\beta} \end{bmatrix} \begin{bmatrix} 1 \\ 0 \end{bmatrix} = \begin{bmatrix} 1-\beta^2 \\ (1-\beta)^2 \end{bmatrix} \qquad \text{EQ. 101}$$

Thus, $h_1 = 1-\beta$ and $h_2 = (1-\beta)^2$, and the final form of the updating equations (EQs. 92, 93) are:

$$\hat{b}_1(T) = \hat{b}_1(T-1) + \hat{b}_2(T-1) + (1-\beta^2)e_1(T) \qquad \text{EQ. 102}$$

$$\hat{b}_2(T) = \hat{b}_2(T-1) + (1-\beta)^2 e_1(T) \qquad \text{EQ. 103}$$

Using the linear trend model of EQ. 2, the estimate of the frequency drift for any future time period, say $T+\tau$, made at the end of period T would be:

$$\hat{x}_{T+\tau}(T) = \hat{b}_1(T) + \hat{b}_2(T)\tau \qquad \text{EQ. 104}$$

With the specification of a value for the discount factor $\beta$, the direct smoothing equations for periodic updating of $\hat{b}_1(T)$ and $\hat{b}_2(T)$ can be considered complete and may be applied for clock synchronization using the guidelines provided herein. The exemplary direct smoothing process is implemented by at least one embodiment of the present invention for clock synchronization between a local clock (e.g., a receiver clock) and a reference clock (e.g., a transmitter clock), as described in detail herein.

Referring now to FIG. 1, an exemplary system 100 implementing a clock synchronization technique in accordance with at least one embodiment of the present invention is illustrated. In the illustrated example, a transmitter 104 is adapted to provide a sequence of timestamps (timestamps 116, 118) to a receiver 114 via a network 150, where the timestamps are transmitted in a sequence of packets (packets 124, 125). Each packet also may include one or more data payloads (data payloads 120, 122) corresponding to the associated timestamp. The receiver 114, using the sequence of timestamps, synchronizes the receiver clock 126 to the transmitter clock 102. The synchronized receiver clock 126 then can be used by the receiver 114 to, for example, process the data payloads 120, 122 of the packets.

To illustrate, the system 100 could include a Voice Over Internet Protocol (VoIP) system whereby a user's voice at the transmitter 104 is converted to digital data, packetized by the transmitter 104, and the packets provided to the receiver 114 with their corresponding timestamps over the network 150. The receiver 114 then stores the data payloads/timestamps in a jitter buffer 146. At the appropriate time, as determined by the associated timestamp and the receiver clock 126, a data payload is extracted from the jitter buffer 146 and converted to an audio output for the user of the receiver 114.

In such an implementation, it often is desirable to maintain synchronization between the transmitter clock 102 of the transmitter 104 and the receiver clock 126 of the receiver 114 to prevent overflow/underflow of the jitter buffer 146, improper timing in the playout of data from the jitter buffer 146, and the like. Accordingly, in at least one embodiment, the receiver 114 utilizes a phase-locked loop (PLL) 130 to synchronize with the transmitter clock 102. The PLL 130 is described in greater detail below.

The transmitter clock 102 of the transmitter 104 typically includes an oscillator 106 and a pulse counter 108. The oscillator 106 issues periodic pulses that are input to the pulse counter 108. The oscillator frequency $f_s$ of the transmitter clock 102 is the inverse of the time interval between consecutive pulses (i.e., the oscillator period). The output of the pulse counter 108 represents the transmitter clock signal 112 and is incremented by a fixed amount at each pulse. Samples of the transmitter clock signal 112 are provided to the receiver 114 as timestamps 116, 118 in a sequence of packets 124, 126 transmitted over the network 150.

Ideally, there would be a constant delay between the transmitter 104 and the receiver 114, and the timestamps 116, 118 arrive at the receiver 114 at the pace at which they are sent. However, packet-switched networks (e.g., network 150) typically do not emulate this ideal case. Delay variation between the transmitter 104 and the receiver 114 during transmission of a sequence of packets (e.g., packets 124, 125) over the network 150 typically complicates a conventional clock synchronization process because of the network jitter introduced at the receiver 114. The receiver 114 may not be able to provide a sufficiently stable and accurate receiver clock signal 144 if the jitter is not filtered out. As a result, in at least one embodiment the PLL 130 is adapted to perform filtering in order to correctly estimate/recover the transmitter clock 102.

Typically it is desired that the design of the PLL 130 must be such that its filtering capabilities do not slow the responsiveness of the PLL 130 and/or increase the amount of time it requires to estimate the clock frequency of the transmitter clock 102. Slow PLL responsiveness and increased transmitter clock estimation time affect the maximum phase error between the transmitter clock 102 and the receiver clock 126 which in turn increases the amount of memory in the receiver 114 that must be allocated to the jitter buffer 146 used to buffer unread data. The jitter buffer 146 often is required to be a least the size of the jitter amplitude (statistical bound) that the receiver 114 is configured to absorb. Packets that experience more delay than the maximum jitter amplitude in this case typically are discarded.

In at least one embodiment, the PLL 130 is adapted to provide a receiver frequency $f_r$ that is substantially synchronized with the frequency $f_s$ of the transmitter clock 102 using the timestamps of a sequence of packets transmitted from the transmitter 104. When the first timestamp of the sequence arrives at the PLL 130, a counter 140 is initialized to the value of the first transmitter timestamp (herein referred to as S(0)). Accordingly, after each pulse (or set number of pulses) of the output signal 152 of the oscillator 138, the counter 140 increments the receiver clock signal 144 starting at the base value S(0).

At the arrival of the each of the remaining transmitter timestamp S(T) of the sequence, a phase detector 132 compares the value of the timestamp S(T) (signal 128) with the timestamp R(T) of the counter 140 at the arrival of the transmitter timestamp S(T). Based on the difference, or error, between the two timestamps R, S, the phase detector 132 provides an error signal $T_e$ (signal 154) to the loop filter 134, where the error signal $T_e$, in one embodiment, is equivalent to the difference between the transmitter timestamp S(T) and the receiver timestamp R(T), i.e., $T_e(T)=S(T)-R(T)$.

In one embodiment, the loop filter 134 is adapted to estimate a frequency offset Δf (signal 156) by which to adjust the receiver frequency $f_r$ of the oscillator 138 based in part on a direct smoothing process of current and prior estimates of the coefficients $b_1$ (intercept) and $b_2$ (slope) of a linear model (EQ. 2) of the error between the transmitter clock 102 and the receiver clock 126. Exemplary implementations of the direct smoothing process by the loop filter 134 are illustrated in greater detail with reference to FIGS. 4 and 5.

The oscillator input conditioner 136, in one embodiment, is adapted to provide a control signal 158 to the oscillator 138 to direct the oscillator 138 to adjust its receiver frequency $f_r$ by the frequency offset Δf determined by the loop filter 134. In one embodiment, the oscillator 138 includes a voltage controlled oscillator (VCO). In this case, the oscillator input conditioner 136 can be adapted to provide a value u (one embodiment of signal 158) to the oscillator 138 that corresponds to a change in the receiver frequency $f_r$ of the oscillator 138 by the frequency offset Δf, wherein the value u is determined based in part on the frequency offset Δf and the receiver frequency $f_r$ prior to the adjustment. In another embodiment, the oscillator 138 includes a digitally controlled oscillator (DCO). In this case, the oscillator input conditioner 136 is adapted to determine the appropriate digital output to direct the oscillator 138 to adjust its receiver frequency $f_r$ by the frequency offset Δf.

For ease of discussion, the loop filter 134 and the oscillator input conditioner 136 are illustrated as separate elements of the PLL 130. However, some or all of the functions of the oscillator input conditioner 136 may be implemented as part of the loop filter 134, and vice versa, without departing from the spirit or the scope of the present invention.

As the frequency $f_r$ of the oscillator 138 changes, the rate-of-increase of receiver clock signal 144 of the counter 140 increases or decreased relative to the adjustments to the receiver frequency $f_r$. Accordingly, as each timestamp of the sequence arrives, the PLL 130 can adjust its receiver frequency $f_r$ to more closely match the frequency $f_s$ of the transmitter clock. Furthermore, because the loop filter 134, in at least one embodiment, is adapted to perform one or both of the direct smoothing processes of FIGS. 4 and 5, both the data storage requirements and the processing effort can be kept to a minimum compared to other known techniques for clock synchronization.

Figure 2:
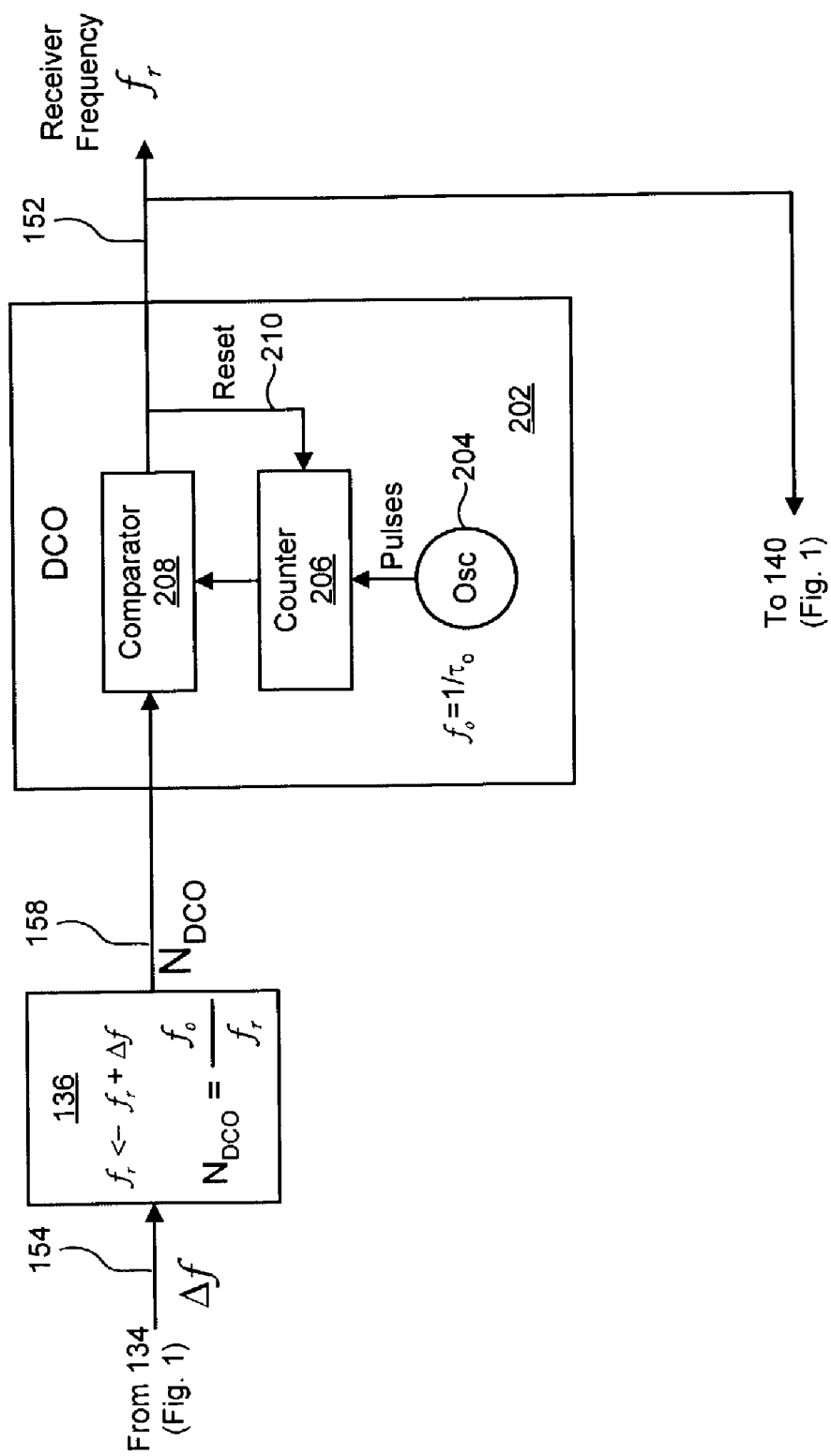
FIG. 2 is a schematic diagram illustrating an exemplary implementation of a digitally controlled oscillator (DCO) in the PLL of FIG. 1 in accordance with at least one embodiment of the present invention.

Referring now to FIG. 2, an exemplary implementation of the oscillator 138 of the PLL 130 as a digitally controller oscillator (DCO) 202 is illustrated in accordance with at least one embodiment of the present invention. As discussed above, in one embodiment the oscillator input conditioner 136 is adapted to provide a signal 158 to the oscillator 138 to direct the oscillator 138 to modify its receiver frequency $f_r$ based in part on the frequency offset Δf (signal 154) provided from the loop filter 134 (FIG. 1). In one embodiment, the oscillator 138 is implemented as the DCO 202 adapted to output a certain frequency based in part on a digital value (signal 158) supplied at its input.

In this case, the oscillator input conditioner 136 may be adapted to determine the desired updated frequency $f_r$ by modifying the previous frequency $f_r$ by the supplied frequency offset Δf (i.e., $f_r=f_r+\Delta f$). Based on the updated frequency $f_r$, the oscillator input conditioner 136 then can determine a digital value $N_{DCO}$ to provide to the DCO 202 to direct the DCO 202 to output the desired updated frequency $f_r$.

In one embodiment, the DCO 202 includes an internal oscillator 204 having a frequency $f_o>>f_r$. For each pulse of the oscillator 204, the internal count value of a counter 206 of the DCO 202 is incremented. A comparator 208 compares the internal count value in the counter 206 with the input value $N_{DCO}$ to determine a match. Each time $N_{DCO}$ is equal to the internal count value during a comparison, the comparator 208 outputs a pulse that serves as both the receiver clock pulse with receiver frequency $f_r$ (signal 152) as well as a reset signal 210 for the counter 206. The frequency $f_r$, therefore, is equal to the ratio of the oscillator frequency $f_o$ to the input value $N_{DCO}$. In effect, the DCO 202 acts as a divide-by-N circuit, where $N=N_{DCO}$. Accordingly, the oscillator input conditioner 136 can be adapted to determine the value for $N_{DCO}$ corresponding to the desired updated receiver frequency $f_r$ by setting the value of $N_{DCO}$ as the ratio of the oscillator frequency $f_o$ to the receiver frequency $f_r$ $$\left(i.e., N_{DCO} = \frac{f_o}{f_r}\right).$$

Figure 3:
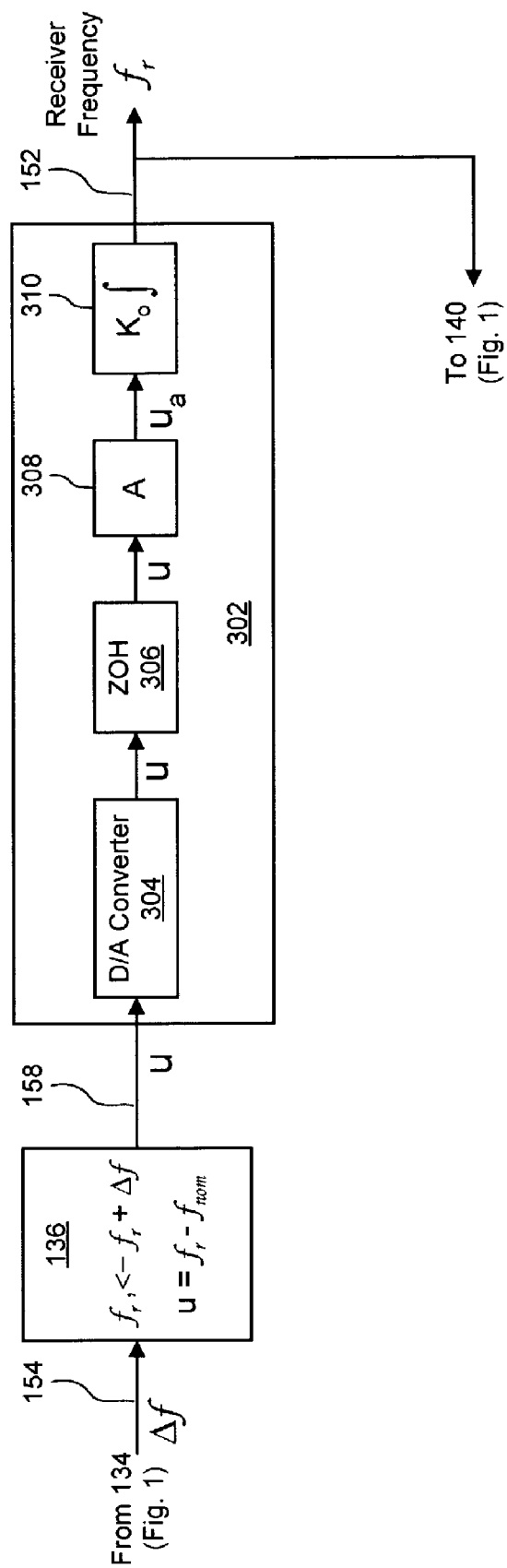
FIG. 3 is a schematic diagram illustrating an exemplary implementation of a voltage controlled oscillator (VCO) in the PLL of FIG. 1 in accordance with at least one embodiment of the present invention.

Referring now to FIG. 3, an exemplary implementation of the oscillator 138 of the PLL 130 as a module containing a voltage controlled oscillator (VCO module) 302 is illustrated in accordance with at least one embodiment of the present invention. Rather than implementing a DCO (DCO 202, FIG. 2) as discussed above, in one embodiment, the PLL 130 implements a VCO 310 to provide the receiver frequency $f_r$ (signal 152), whereby adjustments to the receiver frequency $f_r$ of the VCO 310 are based in part on an input value u (signal 158) received at its input.

In this case, the oscillator input conditioner 136 may be adapted to determine the value for u corresponding to the desired updated frequency $f_r$. After receiving the estimated frequency offset $\Delta f$ from the loop filter 134 (FIG. 1), the oscillator input conditioner 136 determines the desired updated frequency $f_r$ by adjusting the frequency $f_r$ by the frequency offset $\Delta f$. However, in one embodiment, the VCO module 302 is adapted to receive a value for u representative of the difference between the desired receiver frequency $f_r$ and the nominal (or center) frequency $f_{nom}$ of the VCO 310 (i.e., $u=f_r-f_{nom}$). Accordingly, the oscillator input conditioner 136 can be adapted to calculate the value u corresponding to the desired updated frequency $f_r$ and provide this value u to the VCO module 302 as signal 158.

A digital value u can be converted to an analog signal using a digital-to-analog (D/A) converter 304. A zero-order hold (ZOH) circuit 306 may be used (separately or as part of the D/A converter 304) to maintain the same voltage throughout a sample period. The analog voltage then is amplified by amplifier 308 and the amplified voltage is then provided to the VCO 310. Accordingly, the amplifier 308 can be adapted to maintain the input voltage to the VCO 310 within the input voltage range of the VCO 310. Note that the minimum frequency resolution of the VCO 310 generally is dependent on the resolution (i.e., the quantization step size) of the D/A converter 304, where a higher resolution typically provides a finer frequency control of the VCO 310.

Although FIGS. 2 and 3 illustrate various implementations of the oscillator 138 of the PLL 130, those skilled in the art can develop alternate implementations using the guidelines provided herein. To illustrate, the oscillator 138 could include a current controlled oscillator (CCO) rather than a VCO. In this instance, the output signal of the D/A converter 304 could be a controlled current rather than a controlled voltage.

Figure 4:
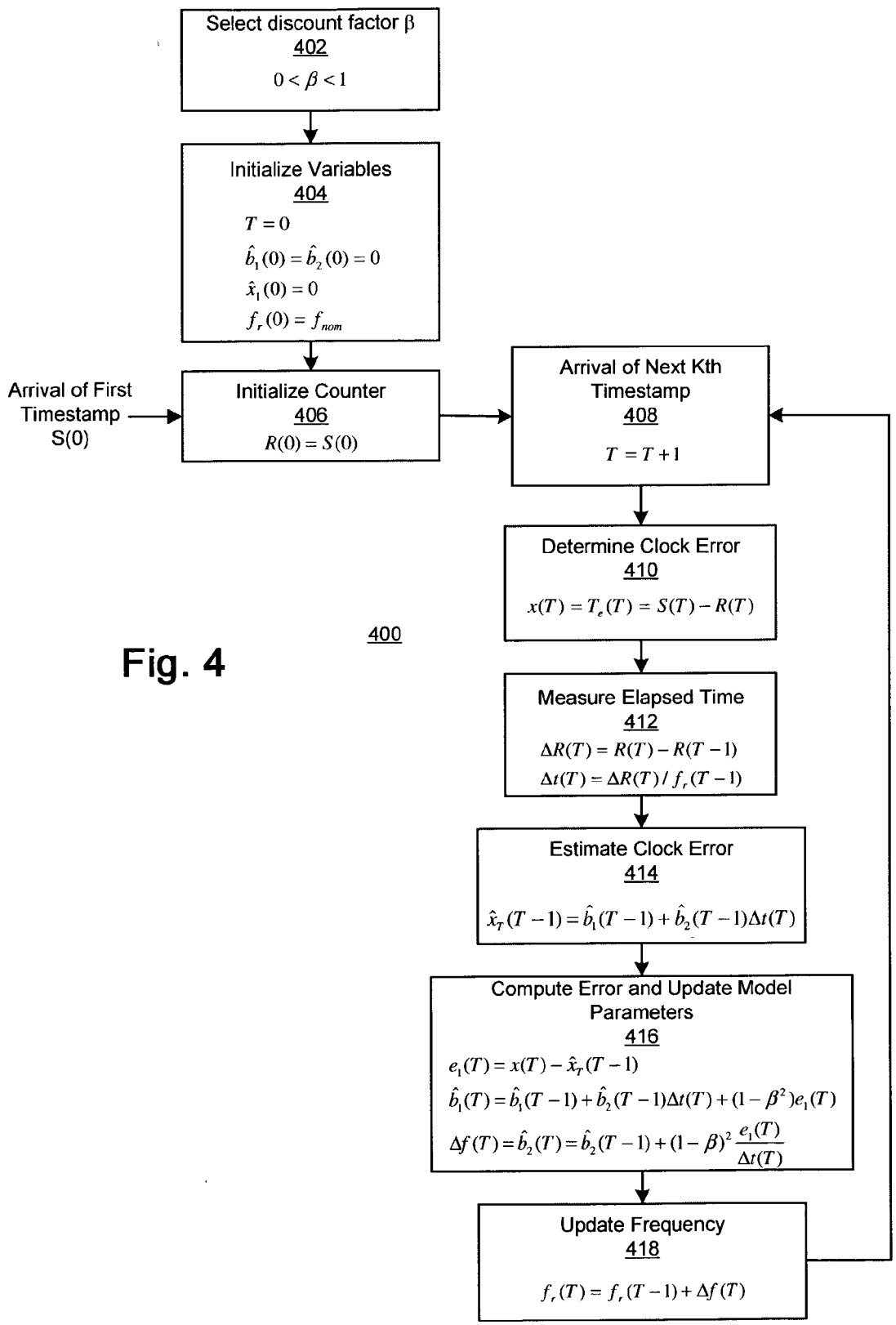
FIG. 4 is a flow diagram illustrating an exemplary method for clock synchronization based in part on a direct smoothing process using an elapsed time value in accordance with at least one embodiment of the present invention.
Figure 5:
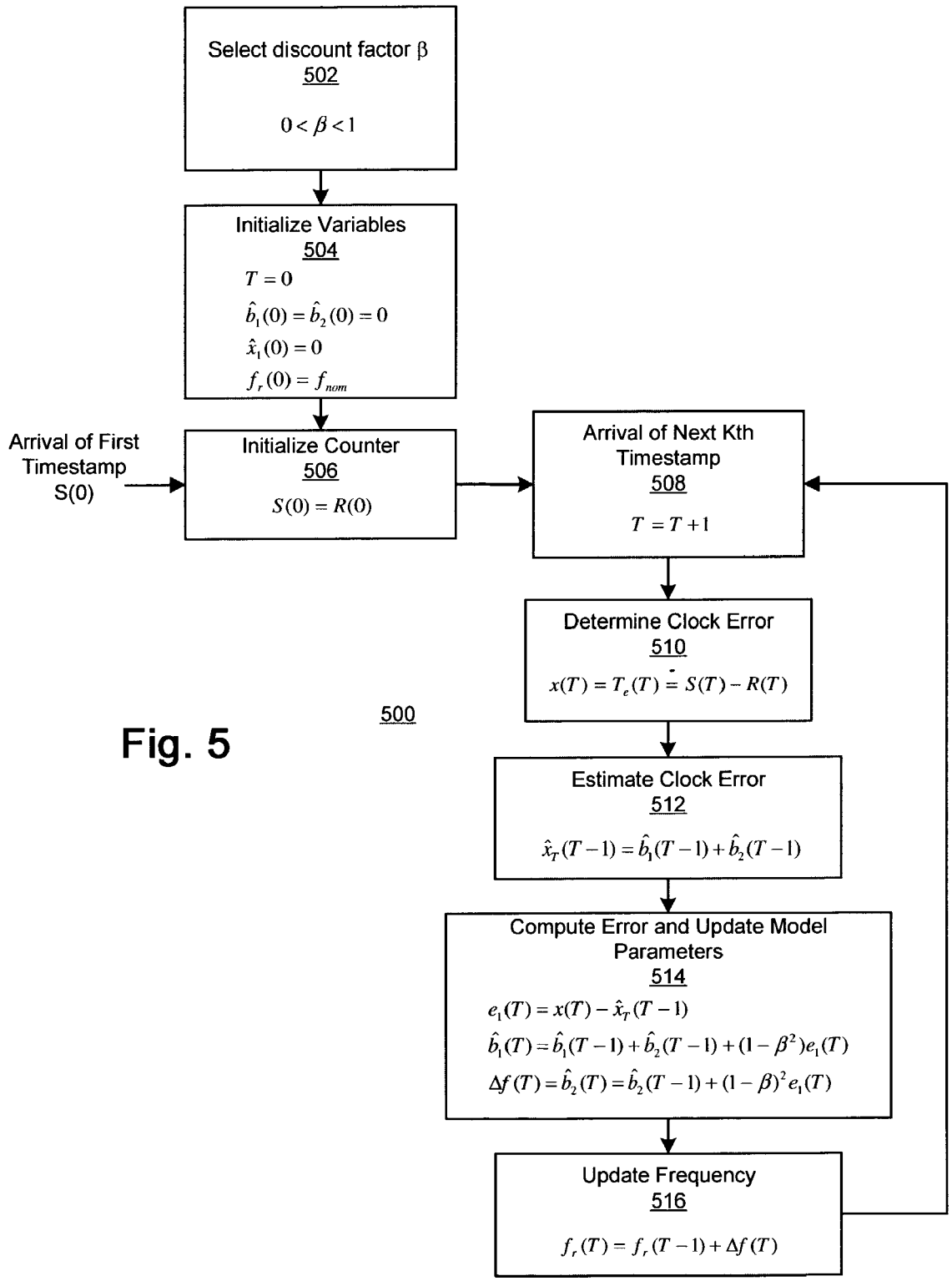
FIG. 5 is a flow diagram illustrating an exemplary method for clock synchronization based in part on a direct smoothing process using a constant elapsed time value in accordance with at least one embodiment of the present invention.

Referring now to FIGS. 4 and 5, exemplary methods for clock synchronization between a transmitter and a receiver based in part on estimation of a frequency offset using a linear model of the frequency error between transmitter timestamp(s) and the corresponding receiver timestamp(s) are illustrated. In at least one embodiment, one or more variations of one or both of the following methods 400, 500 may be utilized by the loop filter 134 of the PLL 130 (FIG. 1) in determining the frequency offset $\Delta f$ by which the receiver frequency $f_r$ of the PLL 130 is modified.

FIG. 4 illustrates an exemplary method 400 for clock synchronization using a direct smoothing process having a variable elapsed time value $\Delta t$ in conjunction with a linear trend model of the error between a local clock and a reference clock. While the exemplary method 400 is discussed below in the context of the loop filter 134 of the PLL 130 of FIG. 1 for ease of illustration, the exemplary method 400 may be implemented in any of a variety of applications without departing from the spirit or the scope of the present invention.

As discussed previously, in at least one embodiment the loop filter 134 is adapted to estimate a frequency offset $\Delta f$ (T) at time T based in part on a direct smoothing of the estimated coefficients of the linear model (EQ. 2) of the timestamp error (i.e., the difference between a transmitter timestamp and the corresponding receiver timestamp) of a subset of a sequence of timestamps received prior to time T. The subset of timestamps can include every Kth timestamp of the sequence, where K>=1. Any appropriate selection of the subset of timestamps from the sequence of timestamps may be used in accordance with the present invention, such as, for example, a bounded random sampling of the sequence.

The method 400 initiates at step 402 whereby an appropriate discount factor $\beta$ is selected, where $0<\beta<1$. The discount factor $\beta$ can be selected based on, for example, a historical performance analysis of a number of potential values for the discount factor $\beta$, by trial-and-error, and the like.

Prior to the receipt of the first timestamp in the sequence, the variables used in the linear model and/or the direct smoothing process are initialized to zero at step 404. That is:

$$T=0 \qquad \text{EQ. 105}$$

$$\hat{b}_1(0)\ \hat{b}_2(0)=0 \qquad \text{EQ. 106}$$

$$\hat{x}(0)=0 \qquad \text{EQ. 107}$$

$$f_r(0)=f_{nom} \qquad \text{EQ. 108}$$

where $\hat{b}_1(T)$, $\hat{b}_2(T)$ are the model coefficients of EQ. 2 at time T, $\hat{x}_T(T-1)$ is the estimated timestamp error for time T made at the end of time T-1, $f_r(T)$ is the desired receiver frequency $f_r$ of the PLL 130 at time T, and $f_{nom}$ is the nominal frequency of the oscillator 138 (FIG. 1) of the PLL 130.

At the receipt of the first arriving transmitter timestamp, S(0), the counter 140 (FIG. 1) is initialized to the value of the timestamp S(0) at step 406, that is:

$$R(0)=S(0) \qquad \text{EQ. 109}$$

Then when the PLL 130 receives the next Kth timestamp S(T) of the sequence (step 408), the phase comparator 132 (FIG. 1) compares the new timestamp S(T) with the local timestamp R(T) from the counter 140 at step 410 to determine the actual error $x(T)=T_e(T)$ between the timestamp S(T) and the local timestamp R(T), where:

$$x(T)=T_e(T)=S(T)-R(T) \qquad \text{EQ. 110}$$

Since x(T) has units of clock ticks (or cycles) and $\hat{b}_2$ has units of clock ticks per second (Hertz), the elapsed time (in seconds) since the last computation and frequency modification is used for computing the estimate $\hat{x}_T$. Note that the elapsed time since the last update, i.e., $\Delta R$ and $\Delta t$, are measured in clock ticks (cycles) and seconds, respectively. At step 412, the elapsed number of clock ticks $\Delta R$ between the previous receiver timestamp R(T-1) and the current timestamp R(T) is calculated, where:

$$\Delta R(T)=R(T)-R(T-1) \qquad \text{EQ. 111}$$

Likewise, in one embodiment, the corresponding elapsed time $\Delta t$ in seconds is calculated as:

$$\Delta t(T) = \frac{\Delta R(T)}{f_r(T-1)} \qquad \text{EQ. 112}$$

where $f_r(T-1)$ represents the previously modified frequency $f_r$ at time T-1. However, rather than calculating the variable value $\Delta t(T)$ for the elapsed time, the exemplary method 400 may be simplified by setting $\Delta t(T)$ equal to a constant value greater than zero (preferably equal to one) due to the self-corrective nature of the direct-smoothing processes. The use of the constant value $\Delta t(T)=1$ in an implementation of the direct smoothing process is discussed in greater detail with reference to FIG. 5.

At step 414, the difference between the transmitter timestamp and the receiver timestamp is estimated based on the linear model of EQ. 2 and using the values of the estimated coefficients $\hat{b}_1$ and $\hat{b}_2$ for the previous time period T−1, where the estimated difference, or error, $\hat{x}_T(T-1)$ can be estimated using the following:

$$\hat{x}_T(T-1) = \hat{b}_1(T-1) + \hat{b}_2(T-1)\Delta t(T) \quad \text{EQ. 113}$$

As EQ. 113 illustrates, the estimated difference can be determined by projecting the linear trend model by the time difference $\Delta t(T)$ using the coefficients $\hat{b}_1$ and $\hat{b}_2$ estimated for the previously-received timestamp of the sequence.

At step 416, the error $e_1$ between the actual timestamp error $x(T)$ at time T and the estimated timestamp error $\hat{x}_T(T-1)$ at time T is calculated, where:

$$e_1(T) = \hat{x}(T) - \hat{x}_T(T-1) \quad \text{EQ. 114}$$

Using the error $e_1$, the coefficients $\hat{b}_1$ and $\hat{b}_2$ of the linear model of EQ. 2 are updated (i.e., re-estimated) at step 416. Since $\hat{b}_1$, $\hat{b}_2$, and $e_1$ have units of ticks, ticks per second, and ticks, respectively, the updating equations are structured in such a way that the units of all terms in the equations are consistent, resulting in the following update equations:

$$\hat{b}_1(T) = \hat{b}_1(T-1) + \hat{b}_2(T-1)\Delta t(T) + (1-\beta^2)e_1(T) \quad \text{EQ. 115}$$

$$\hat{b}_2(T) = \hat{b}_2(T-1) + (1-\beta)^2 \frac{e_1(T)}{\Delta t(T)} \quad \text{EQ. 116}$$

In at least one embodiment, the updated slope coefficient $\hat{b}_2(T)$ represents the frequency offset $\Delta f(T)$ by which the receiver frequency $f_r$ of the PLL 130 is to be modified. Accordingly, at step 418, the value of $f_r$ at the previous time period T−1 and the frequency offset $\Delta f$ are used to estimate the updated value of the frequency $f_r$ at time T as follows:

$$f_r(T) = f_r(T-1) + \Delta f(T) \quad \text{EQ. 117}$$

The updated frequency $f_r(T)$ then can be utilized by the oscillator input conditioner 136 (FIG. 1) to direct the oscillator 138 (FIG. 1) to modify its output frequency to match the updated frequency $f_r(T)$. For the arrival of each successive timestamp of the sequence of timestamps (step 408), the value of T is incremented by one and the steps 410–418 are repeated.

As described above, a relatively small number of calculations need be performed, thereby increasing the speed at which a device or application performing the method 400 can operate. Likewise, because only the values of the variables/coefficients of the linear model and/or direct smoothing process from the time period immediately previous to the current time period being analyzed, the storage requirements of the PLL 130 can be reduced, which thereby may reduce the cost, size, complexity, and/or energy consumption of the PLL 130.

FIG. 5 illustrates a variation of the exemplary method 400 of FIG. 4 wherein a constant value $\Delta t(T)=1$ is utilized rather than calculating the actual elapsed time between receiver timestamps. Although the constant value for $\Delta t(T)$ preferably is between 0.5 and 1.5, more preferably is substantially equal to one (i.e., between 0.9 and 1.1), and most preferably is exactly equal to 1, other non-negative constant values for $\Delta t(T)$ may be used without departing from the spirit or the scope of the present invention. While the exemplary method 500 is discussed below in the context of the loop filter 134 of the PLL 130 of FIG. 1 for ease of illustration, the exemplary method 500 may be implemented in any of a variety of applications, using the guidelines provided herein.

As discussed previously, in at least one embodiment, the loop filter 134 is adapted to estimate a frequency offset $\Delta f(T)$ at time T based in part on a direct smoothing of the estimated coefficients of the linear model (EQ. 2) of the timestamp error (i.e., the difference between a transmitter timestamp and the corresponding receiver timestamp) of a subset of a sequence of timestamps received prior to time T.

The method 500 initiates at step 502 whereby an appropriate discount factor $\beta$ is selected, where $0<\beta<1$. An appropriate constant value for $\Delta t(T)$ also may be selected, where the constant value includes a real number greater than zero. In the following example, a constant value of one is utilized for $\Delta t(T)$.

Prior to the receipt of the first timestamp in the sequence, the variables used in the linear model and/or the direct smoothing process are initialized to zero at step 504. That is:

$$T=0 \quad \text{EQ. 105}$$

$$\hat{b}_1(0) = \hat{b}_2(0) = 0 \quad \text{EQ. 106}$$

$$\hat{x}_T(0) = 0 \quad \text{EQ. 107}$$

$$f_r(0) = f_{nom} \quad \text{EQ. 108}$$

where $\hat{b}_1(T)$, $\hat{b}_2(T)$ are the model coefficients of EQ. 2 at time T, $\hat{x}_T(T-1)$ is the estimated timestamp error for time T made at the end of time T−1, $f_r(T)$ is the desired receiver frequency $f_r$ of the PLL 130 at time T, and $f_{nom}$ is the nominal frequency of the oscillator 138 (FIG. 1) of the PLL 130.

At the receipt of the first arriving transmitter timestamp, S(0), the counter 140 (FIG. 1) is initialized to the value of the timestamp S(0) at step 506, that is:

$$R(0) = S(0) \quad \text{EQ. 109}$$

Then when the PLL 130 receives the next Kth timestamp S(T) of the sequence (step 508), the phase comparator 132 (FIG. 1) compares the new timestamp S(T) with the local timestamp R(T) from the counter 140 at step 510 to determine the actual error $x(T) = T_e(T)$ between the timestamp S(T) and the local timestamp R(T), where:

$$x(T) = T_e(T) = S(T) - R(T) \quad \text{EQ. 110}$$

At step 512, the difference between the transmitter timestamp and the receiver timestamp is estimated based on the linear model of EQ. 2 and using the values of the estimated coefficients $\hat{b}_1$ and $\hat{b}_2$ for the previous time period T−1, where the estimated difference, or error, $\hat{x}_T(T-1)$ can be estimated using the following:

$$\hat{x}_T(T-1) = \hat{b}_1(T-1) + \hat{b}_2(T-1) \quad \text{EQ. 118}$$

At step 514, the error $e_1$ between the actual timestamp error $x(T)$ at time T and the estimated timestamp error $\hat{x}_T(T-1)$ at time T is calculated, where:

$$e_1(T) = x(T) - \hat{x}_T(T-1) \quad \text{EQ. 114}$$

Using the error $e_1$, the coefficients $b_1$ and $b_2$ of the linear model of EQ. 2 are updated (i.e., re-estimated) at step 514 using the following update equations:

$$\hat{b}_1(T) = \hat{b}_1(T-1) + \hat{b}_2(T-1) + (1-\beta^2)e_1(T) \quad \text{EQ. 119}$$

$$\hat{b}_2(T) = \hat{b}_2(T-1) + (1-\beta)^2 e_1(T) \quad \text{EQ. 120}$$

Recall that the updated slope coefficient $\hat{b}_2(T)$ may represent the frequency offset $\Delta f(T)$ by which the receiver frequency $f_r$ of the PLL 130 is to be modified. Accordingly, at step 516, the value of $f_r$ at the previous time period T−1 and the frequency offset Δf are used to estimate the updated value of the frequency $f_r$ at time T as follows:

$$f_r(T) = f_r(T-1) + \Delta f(T) \quad \text{EQ. 117}$$

The updated frequency $f_r(T)$ then can be utilized by the oscillator input conditioner 136 (FIG. 1) to direct the oscillator 138 (FIG. 1) to modify its output frequency to match the updated frequency $f_r(T)$. For the arrival of each successive timestamp of the sequence of timestamps (step 508), the value of T is incremented by one and the steps 510–516 are repeated.

Figure 6:
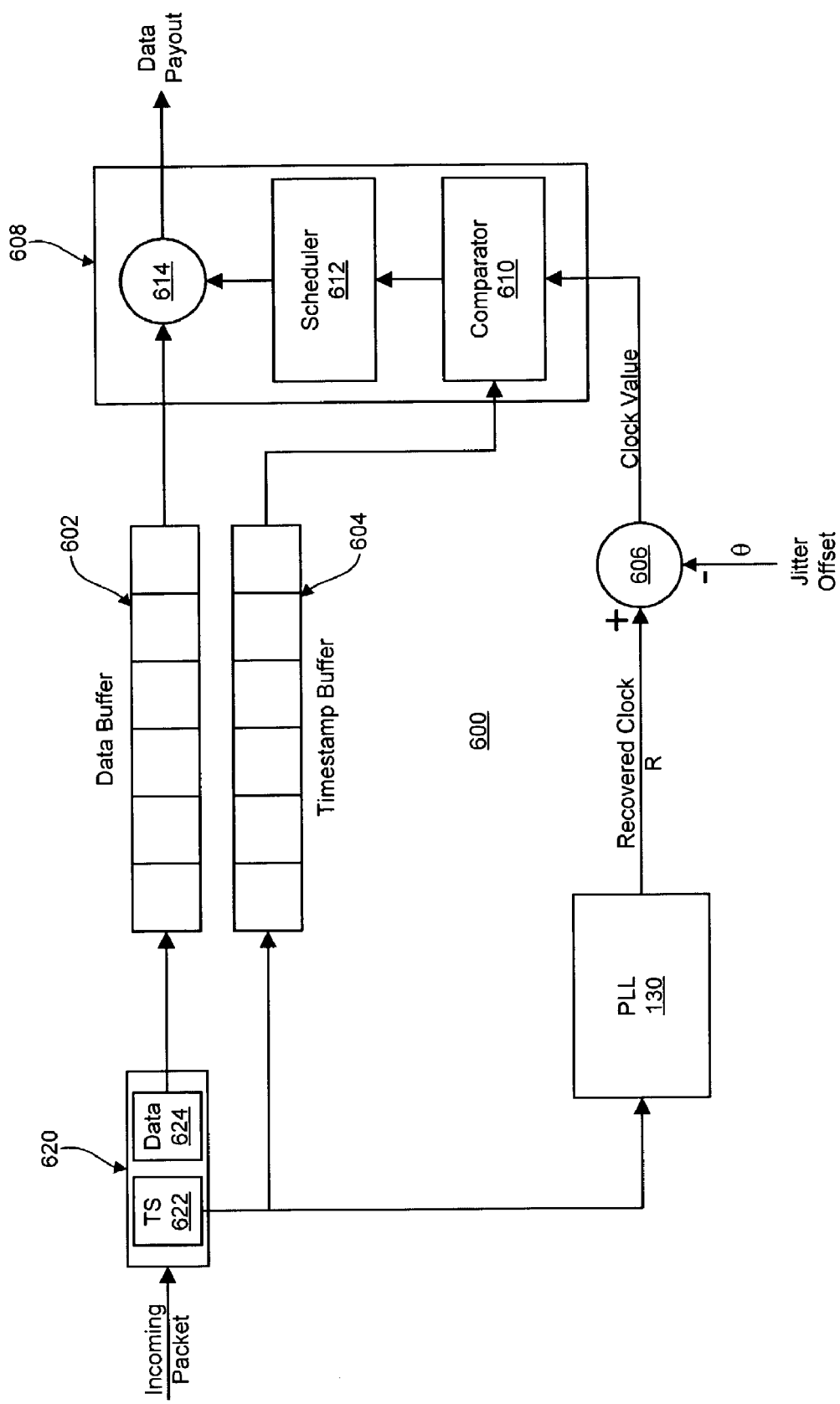
FIG. 6 is a schematic diagram illustrating an exemplary data playout system in accordance with at least one embodiment of the present invention.

Referring now to FIG. 6, an exemplary implementation of the PLL 130 in a data playout system 600 is illustrated in accordance with at least one embodiment of the present invention. In the illustrated example, the system 600 includes a data buffer 602, a timestamp buffer 604, the PLL 130, a jitter offset module 606, and a playout module 608 having a comparator 610, a scheduler 612, and a time-division multiplexer (TDM) 614.

An exemplary playout process of the system 600 using a recovered reference clock signal and the counter value R(t) of the counter 140 (FIG. 1) of the PLL 130 can be described as follows. For each data packet 620 of a sequence of packets arriving from a transmitter over a packet network (not shown), the timestamp (TS) 622, S(t), of the packet 620 is read and stored in the timestamp buffer 604 and the data payload 624 of the packet 620 is placed in the receiver data buffer 602. A copy of the timestamp 622 is also provided to the PLL 130.

Using the transmitter timestamps 622 from the sequence of packets 620, the PLL 130, in one embodiment, is adapted to determine a frequency offset Δf representing an error between the frequency $f_r$ of the oscillator 138 (FIG. 1) and the frequency $f_s$ of the transmitter. The PLL 130 then may adjust the frequency $f_r$ by the frequency offset Δf to more closely match the oscillator frequency $f_s$ of the transmitter. In at least one embodiment, the PLL 130 determines the frequency offset Δf using one or both of the direct smoothing processes discussed above with reference to FIGS. 4 and 5.

Using the synchronized oscillator 138, the internal count of the counter 140 (FIG. 1) of the PLL 130 is monotonically increased. The internal count, representing the synchronized clock R(t) is provided to the playout module 608 for use in timing the playout of data payloads from the data buffer 602. However, since there may be a delay or jitter component in the recovered clock R(t) due to jitter or delay in the packet network between the transmitter an the receiver implementing the system 600, in one embodiment, the jitter offset module 606 is adapted to adjust the recovered clock R(t) by a jitter offset θ to generate a modified clock R'(t) where R'(t)=R(t)−θ. The jitter offset θ preferably is selected to account for the maximum jitter amplitude and packet loss rate that is or may be present. Accordingly, the size of the buffers 602, 604 preferably are at least the size of the statistical bound of the delay variations. The modified clock R'(t) then may be provided to the playout module 608 for timing the output of data from the data buffer 602.

The comparator 610 of the playout module 608 periodically compares the modified clock R'(t) (or the original clock R(t)) with the timestamp stored at the front of the timestamp buffer 604. When the modified clock R'(t) is equal to the timestamp (or within a predetermined range of the timestamp), the comparator 610 sends a signal to the scheduler 612 indicating a match. The scheduler, based on this signal, directs the TDM 614 to output the corresponding data payload from the data buffer 602 and provide the data payload to the intended destination. Likewise, the timestamp at the front of the buffer 604 is removed and the comparator 610 periodically compares the next timestamp in the buffer 604 to the modified clock value R'(t) obtained from the counter 140 of the PLL 130. The process of comparing the modified clock R'(t) (or R(t)) with the timestamp at the front of the buffer 604 and outputting the corresponding data payload from the data buffer 602 when there is a match may be repeated for each packet or a subset of packets of the sequence.

The exemplary system 600 may be implemented in any of a variety of applications having stringent timing requirements, such as multimedia applications, telephony applications, and the like. To illustrate, the system 600 could be utilized in a Voice over Internet Protocol (VoIP) application whereby voice communications are packetized by a transmitter and the resulting packets are then transmitted over a packet switched network to a receiver. The receiver, using its local clock, provides the data payload of each packet to a playout application at a time corresponding to the timestamp associated with the data payload. The playout application then converts the digital data to an analog signal (i.e., sound) for reception by the user of the receiver. The system 600 can be implemented to buffer the data payloads of the VoIP packets and provide the data payloads to a VoIP playout application at the appropriate time using the clock of the PLL 130.

Since the timing of the playout of the VoIP data payloads typically is critical to prevent garbled or otherwise unintelligible audio playback, often it is beneficial to synchronize the receiver's clock with the clock of the transmitter. Accordingly, the PLL 130 can periodically adjust the frequency $f_r$ to more closely match the frequency $f_s$ of the transmitter clock, thus synchronizing the receiver clock to the transmitter clock and providing for a higher-fidelity playout of the audio content of the VoIP packets.

At this point it should be noted that techniques for clock synchronization in accordance with the present invention as described above typically involve the processing of input data and the generation of output data to some extent. This input data processing and output data generation may be implemented in hardware or software. For example, specific electronic components may be employed in a processor, integrated circuit, or similar or related circuitry for implementing the functions associated with clock synchronization in accordance with the present invention as described above. Alternatively, one or more processors operating in accordance with stored instructions may implement the functions associated with the exemplary clock synchronization techniques in accordance with the present invention as described above. If such is the case, it is within the scope of the present invention that such instructions may be stored on one or more processor readable media, or transmitted to one or more processors via one or more signals.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for synchronizing a clock of a receiver with a clock of a transmitter, wherein the transmitter is adapted to transmit a sequence of time references to the receiver, each time reference being representative of a time of the transmitter clock at the transmission of the time reference, the method comprising the steps of:

for each time reference of a subset of the sequence:
estimating a difference between the time reference and a time of the receiver clock corresponding to a reception of the time reference, wherein the difference is estimated based at least in part on a linear model of at least one previous difference between at least one previous time reference and a time of the receiver clock corresponding to a reception of each of the at least one previous time references;
updating an intercept coefficient of the linear model based at least in part on a previous value of the intercept coefficient associated with a previously received time reference, a previous value of a slope coefficient of the linear model associated with the previously received time reference, and an error between an actual difference between the time reference and the time of the receiver clock at the reception of the time reference and the estimated difference;
updating a slope coefficient of the linear model based at least in part on the previous value of the slope coefficient, and the error between an actual difference and the estimated difference; and
modifying, for each time reference of the subset, a frequency of the receiver clock by a frequency offset based at least in part on the updated slope coefficient;
wherein the difference is estimated based at least in part on an equation:

$$\hat{x}_T(T-1) = \hat{b}_1(T-1) + \hat{b}_2(T-1)\Delta t(T)$$

where $\hat{x}_T(T-1)$ represents the estimated difference associated with a time reference received at time T and determined at a previous time reference received at time T−1, $\hat{b}_1(T-1)$ represents a value of the intercept coefficient associated with a previous time reference received at time T−1 previous to time T, $\hat{b}_2(T-1)$ represents a value of the slope coefficient associated with the previous time reference, and $\Delta t(T)$ represents one of a group consisting of: an elapsed time between the reception of the time reference and the reception of the previous time reference and a constant value substantially equal to one.

2. The method as in claim 1, wherein the step of updating the intercept coefficient is based at least in part on an equation:

$$\hat{b}_1(T) = \hat{b}_1(T-1) + \hat{b}_2(T-1)\Delta t(T) + (1-\beta^2)e_1(T)$$

where $\hat{b}_1(T)$ represents an updated value of the intercept coefficient associated with a time reference received at a time T, $\hat{b}_1(T-1)$ represents a value of the intercept coefficient associated with a previous time reference received at time T−1 previous to time T, $\hat{b}_2(T-1)$ represents a value of the slope coefficient associated with the previous time reference, $\beta$ represents a real-value weighting factor between zero and one, $e_1(T)$ represents the error between the actual difference and the estimated difference; and $\Delta t(T)$ represents one of a group consisting of: an elapsed time between the reception of the time reference and the reception of the previous time reference and a constant value substantially equal to one.

3. The method as in claim 1, wherein the step of updating the slope coefficient is based at least in part on an equation:

$$\hat{b}_2(T) = \hat{b}_2(T-1) + (1-\beta)^2 \frac{e_1(T)}{\Delta t(T)}$$

where $\hat{b}_2(T)$ represents an updated value of the slope coefficient associated with a time reference received at a time T, $\hat{b}_2(T-1)$ represents a value of the slope coefficient associated with a previous time reference received at time T−1 previous to time T, $\beta$ represents a real-value weighting factor between zero and one, $e_1(T)$ represents the error between the actual difference and the estimated difference; and $\Delta t(T)$ represents either an elapsed time between the reception of the time reference and the reception of the previous time reference or a constant value substantially equal to one.

4. The method as in claim 1, wherein the frequency offset is based at least in part on the slope coefficient associated with the time reference.

5. The method as in claim 4, wherein the step of modifying the frequency of the receiver clock is based at least in part on an equation:

$$f_r(T) = f_r(T-1) + \Delta f(T)$$

where $f_r(T)$ represents the frequency of the receiver clock after modification, $f_r(T-1)$ represents the frequency of the receiver clock prior to modification, and $\Delta f(T)$ represents a frequency offset equivalent to the slope coefficient associated with the time reference received at time T.

6. The method as in claim 1, wherein the transmitter and receiver are part of a packet-switched network, and wherein the sequence of time references include a sequence of timestamps transmitted from the transmitter to the receiver as packets over the packet-switched network.

7. A computer signal embodied in a carrier wave readable by a computing system and encoding a computer program of instructions for executing a computer process for performing the method recited as in claim 1.

8. A phase-locked loop (PLL) for synchronizing a local clock to a reference clock, the PLL comprising:
an oscillator being adapted to output a local frequency;
a loop filter being adapted to:
for each time reference of a sequence of time references of the reference clock:
estimate a difference between the time reference and a time of the local clock corresponding to a reception of the time reference, wherein the difference is estimated based at least in part on a linear model of at least one previous difference between at least one previous time reference and a time of the receiver clock corresponding to a reception of each of the at least one previous time references;
update an intercept coefficient of the linear model based at least in part on a previous value of the intercept coefficient associated with a previous time reference of the sequence, a previous value of a slope coefficient of the linear model associated with the previous time reference, and an error between an actual difference between the time reference and a time of the local clock at the reception of the time reference and the estimated difference; and update a slope coefficient of the linear model based at least in part on the previous value of the slope coefficient, and the error between the actual difference and the estimated difference;
wherein the loop filter is adapted to estimate the difference based at least in part on an equation:

$$\hat{x}_T(T-1) = \hat{b}_1(T-1) + \hat{b}_2(T-1)\Delta t(T)$$

where $\hat{x}_T(T-1)$ represents the estimated difference associated with a time reference received at time T and determined at a previous time reference received at time T−1, $\hat{b}_1(T-1)$ represents a value of the intercept coefficient associated with a previous time reference received at time T−1 previous to time T, $\hat{b}_2(T-1)$ represents a value of the slope coefficient associated with the previous time reference, and $\Delta t(T)$ represents one of a group consisting of: an elapsed time between the reception of the time reference and the reception of the previous time reference and a constant value substantially equal to one; and an oscillator input conditioner operably connected to the loop filter and the oscillator and being adapted to modify the local frequency of the oscillator by a frequency offset based at least in part on the updated slope coefficient.

9. The PLL as in claim 8, further comprising:
a counter operably connected to the oscillator and being adapted to convert the local frequency into a local clock reference; and
a phase detector operably connected to the loop filter and the counter and being adapted to determine, for each time reference of the sequence, an error based at least in part on a difference between the time reference and a corresponding time reference of the counter.

10. The PLL as in claim 8, wherein the loop filter is adapted to update the intercept coefficient based at least in part on an equation:

$$\hat{b}_1(T) = \hat{b}_1(T-1) + \hat{b}_2(T-1)\Delta t(T) + (1-\beta^2)e_1(T)$$

where $\hat{b}_1(T)$ represents an updated value of the intercept coefficient associated with a time reference received at time T, $\hat{b}_1(T-1)$ represents a value of the intercept coefficient associated with a previous time reference received at time T−1 previous to time T, $\hat{b}_2(T-1)$ represents a value of the slope coefficient associated with the previous time reference, $\beta$ represents a real-value weighting factor between zero and one, $e_1(T)$ represents the error between the actual difference and the estimated difference, and $\Delta t(T)$ represents one of a group consisting of: an elapsed time between the reception of the time reference and the reception of the previous time reference and a constant value substantially equal to one.

11. The PLL as in claim 8, wherein loop filter is adapted to update the slope coefficient based at least in part on an equation:

$$\hat{b}_2(T) = \hat{b}_2(T-1) + (1-\beta)^2 \frac{e_1(T)}{\Delta t(T)}$$

where $\hat{b}_2(T)$ represents an updated value of the slope coefficient associated with a time reference received at a time T, $\hat{b}_2(T-1)$ represents a value of the slope coefficient associated with a previous time reference received at time T−1 previous to time T, $\beta$ represents a real-value weighting factor between zero and one, $e_1(T)$ represents the error between the actual difference and the estimated difference, and $\Delta t(T)$ represents one of a group consisting of: an elapsed time between the reception of the time reference and the reception of the previous time reference and a constant value substantially equal to one.

12. The PLL as in claim 8, wherein oscillator input conditioner is adapted to modify the frequency of the local clock based at least in part on an equation:

$$f_r(T) = f_r(T-1) + \Delta f(T)$$

where $f_r(T)$ represents the frequency of the local clock after modification, $f_r(T-1)$ represents the frequency of the local clock prior to modification, and $\Delta f(T)$ represents a frequency offset equivalent to the slope coefficient associated with a time reference received at time T.

13. The PLL as in claim 8, wherein the reference clock is a clock of a transmitter and the local clock is a clock of a receiver in a packet-switched network, and wherein the sequence of time references include a sequence of timestamps transmitted from the transmitter to the receiver as packets over the packet-switched network.

14. In a packet-switched network, a system for playout of data of a sequence of packets transmitted from a transmitter, the system comprising:
a data buffer being adapted to store a data payload of each packet of the sequence of packets;
a timestamp buffer being adapted to store a transmitter timestamp of each packet of the sequence of packets, the transmitter timestamp being representative of a time of a clock of the transmitter at a transmission of the packet;
a playout module operably connected to the data buffer and the timestamp buffer and being adapted to direct an output of a data payload from the data buffer when a corresponding transmitter timestamp in the timestamp buffer is equivalent to a time of a local clock; and
a phased-lock loop (PLL) being adapted to provide the local clock and being further adapted to:
for each packet of the sequence of packets:
estimate a difference between a timestamp of the packet and a time of the local clock corresponding to a reception of the packet, wherein the difference is estimated based at least in part on a linear model of at least one previous difference between at least one previous time reference and a time of the receiver clock corresponding to a reception of each of the at least one previous time references;
update an intercept coefficient of the linear model based at least in part on a previous value of the intercept coefficient associated with a previous packet of the sequence, a previous value of a slope coefficient of the linear model associated with the previous packet, and an error between an actual difference between the timestamp and the time of the local clock at reception of the time reference and the estimated difference;
update the slope coefficient of the linear model based at least in part on the previous value of the slope coefficient, and the error between the actual difference and the estimated difference; and
modify a frequency of the local clock by a frequency offset based at least in part on the updated slope coefficient;
wherein the PLL is adapted to estimate the difference based at least in part on an equation:

$$\hat{x}_T(T-1) = \hat{b}_1(T-1) + \hat{b}_2(T-1)\Delta t(T)$$

where $\hat{x}_T(T-1)$ represents the estimated difference associated with a timestamp received at time T and determined at a previous time reference received at time T−1, $\hat{b}_1(T-1)$ represents a value of the intercept coefficient associated with a previous timestamp received at time T−1 previous to time T, $\hat{b}_2(T-1)$ represents a value of the slope coefficient associated with the previous timestamp, and $\Delta t(T)$ represents one of a group consisting of: an elapsed time between the reception of the timestamp and the reception of the previous timestamp and a constant value substantially equal to one.

15. The system as in claim 14, wherein the PLL is adapted to update the intercept coefficient based at least in part on an equation:

$$\hat{b}_1(T) = \hat{b}_2(T-1)\Delta t(T) + (1-\beta^2)e_1(T)$$

where $\hat{b}_1(T)$ represents an updated value of the intercept coefficient associated with a timestamp received at time T, $\hat{b}_1(T-1)$ represents a value of the intercept coefficient associated with a previous timestamp received at time T−1 previous to time T, $\hat{b}_2(T-1)$ represents a value of the slope coefficient associated with the previous timestamp, β represents a real-value weighting factor between zero and one, $e_1(T)$ represents the error between the actual difference and the estimated difference, and $\Delta t(T)$ represents one of a group consisting of: an elapsed time between the reception of the time reference and the reception of the previous time reference and a constant value substantially equal to one.

16. The system as in claim 14, wherein the PLL is adapted to update the slope coefficient based at least in part on an equation:

$$\hat{b}_2(T) = \hat{b}_2(T-1) + (1-\beta)^2 \frac{e_1(T)}{\Delta t(T)}$$

where $\hat{b}_2(T)$ represents an updated value of the slope coefficient associated with a timestamp received at a time T, $\hat{b}_2(T-1)$ represents a value of the slope coefficient associated with a previous timestamp received at time T−1 previous to time T, β represents a real-value weighting factor between zero and one, $e_1(T)$ represents the error between the actual difference and the estimated difference, and $\Delta t(T)$ represents one of a group consisting of: an elapsed time between the reception of the time reference and the reception of the previous time reference and a constant value substantially equal to one.

17. The system as in claim 14, wherein the PLL is adapted to modify the frequency of the local clock based at least in part on an equation:

$$f_r(T) = f_r(T-1) + \Delta f(T)$$

where $f_r(T)$ represents the frequency of the local clock after modification, $f_r(T-1)$ represents the frequency of the local clock prior to modification, and $\Delta f(T)$ represents a frequency offset equivalent to the slope coefficient associated with the time reference received at time T.

* * * * *